(12) United States Patent
Dropps

(10) Patent No.: US 11,716,088 B2
(45) Date of Patent: Aug. 1, 2023

(54) ANALOG SYSTEM AND ASSOCIATED METHODS THEREOF

(71) Applicant: Frank R. Dropps, Annandale, MN (US)

(72) Inventor: Frank R. Dropps, Annandale, MN (US)

(*) Notice: Subject to any disclaimer, the term of this patent is extended or adjusted under 35 U.S.C. 154(b) by 0 days.

(21) Appl. No.: 17/517,121

(22) Filed: Nov. 2, 2021

(65) Prior Publication Data

US 2022/0060192 A1   Feb. 24, 2022

Related U.S. Application Data

(63) Continuation of application No. 17/102,280, filed on Nov. 23, 2020, now Pat. No. 11,196,432, which is a
(Continued)

(51) Int. Cl.
| | |
|---|---|
| *H03M 1/06* | (2006.01) |
| *H03M 1/12* | (2006.01) |
| *G01K 1/02* | (2021.01) |
| *H03M 1/08* | (2006.01) |
| *H03M 1/10* | (2006.01) |
| *G01K 7/01* | (2006.01) |

(Continued)

(52) U.S. Cl.
CPC ............ *H03M 1/06* (2013.01); *G01K 1/02* (2013.01); *H03M 1/0809* (2013.01); *H03M 1/089* (2013.01); *H03M 1/0845* (2013.01); *H03M 1/1009* (2013.01); *H03M 1/1071* (2013.01); *H03M 1/12* (2013.01); *H03M 1/1245* (2013.01); *G01K 1/14* (2013.01); *G01K 3/04* (2013.01); *G01K 7/01* (2013.01); *G01K 7/42* (2013.01); *G01K 13/20* (2021.01); *G01K 2219/00* (2013.01); *H03M 1/00* (2013.01); *H03M 1/361* (2013.01)

(58) Field of Classification Search
CPC .... H03M 1/06; H03M 1/0809; H03M 1/0845; H03M 1/089; H03M 1/1071; H03M 1/12; H03M 1/1245; G01K 1/02
See application file for complete search history.

(56) References Cited

U.S. PATENT DOCUMENTS

| | | |
|---|---|---|
| 5,119,098 A | 6/1992 | Komatsu et al. |
| 5,327,131 A | 7/1994 | Ueno et al. |

(Continued)

OTHER PUBLICATIONS

Notice of Allowance from USPTO dated Mar. 16, 2017 for related U.S. Appl. No. 15/284,087.

(Continued)

*Primary Examiner* — Joseph J Lauture
(74) *Attorney, Agent, or Firm* — Loza & Loza, LLP; Tejinder Singh

(57) ABSTRACT

Methods and devices are provided for circuits. One device includes an adjustment circuit having an adjustable resistor for modifying a resistance value of a resistive device, the adjustment circuit connected to an adjustment terminal of the resistive device. The resistance value of the adjustable resistor changes, when a voltage or charge on the adjustment terminal of the adjustable resistor is changed. The adjustable resistor is a phase change element with an adjusting terminal to which different voltage values are applied for adjusting a conversion device threshold value.

13 Claims, 16 Drawing Sheets

Related U.S. Application Data continuation of application No. 16/788,201, filed on Feb. 11, 2020, now Pat. No. 10,855,298, which is a continuation of application No. 16/394,975, filed on Apr. 25, 2019, now Pat. No. 10,601,432, which is a continuation of application No. 15/789,728, filed on Oct. 20, 2017, now Pat. No. 10,298,246, which is a continuation of application No. 15/614,977, filed on Jun. 6, 2017, now Pat. No. 9,831,883, which is a continuation of application No. 15/284,087, filed on Oct. 3, 2016, now Pat. No. 9,698,803.

(51) Int. Cl.
  *G01K 1/14* (2021.01)
  *H03M 1/00* (2006.01)
  *G01K 3/04* (2006.01)
  *G01K 7/42* (2006.01)
  *H03M 1/36* (2006.01)
  *G01K 13/20* (2021.01)

(56) References Cited

U.S. PATENT DOCUMENTS

| | | |
|---|---|---|
| 6,982,664 B1 | 1/2006 | Nairn |
| 7,356,426 B2 | 4/2008 | Jain et al. |
| 8,254,200 B2 | 8/2012 | Eid et al. |
| 9,270,929 B2 | 2/2016 | Kuo et al. |
| 9,793,910 B1 * | 10/2017 | Devarajan ............ H03M 1/124 |
| 2005/0135430 A1 * | 6/2005 | Le ........................... G11C 7/22 |
| | | 370/537 |
| 2006/0161373 A1 | 7/2006 | Mangrulkar et al. |
| 2007/0176683 A1 | 8/2007 | Oba et al. |
| 2008/0198055 A1 | 8/2008 | Matsubayashi |
| 2010/0327322 A1 | 12/2010 | Kub et al. |
| 2014/0232577 A1 | 8/2014 | Noguchi |

OTHER PUBLICATIONS

Office Action from USPTO dated Jul. 20, 2017 for related U.S. Appl. No. 15/614,977.
Notice of Allowance from USPTO dated Sep. 13, 2017 for related U.S. Appl. No. 15/614,977.
Office Action from USPTO dated Sep. 17, 2018 for related U.S. Appl. No. 15/789,728.
Notice of Allowance from USPTO dated Jan. 17, 2019 for related U.S. Appl. No. 15/789,728.
Office Action from USPTO dated Aug. 22, 2019 for related U.S. Appl. No. 16/394,975.
Notice of Allowance from USPTO dated Nov. 22, 2019 for related U.S. Appl. No. 16/394,975.
Office Action from USPTO dated Apr. 8, 2020 for related U.S. Appl. No. 16/788,201.
Notice of Allowance from USPTO dated Aug. 6, 2020 for related U.S. Appl. No. 16/788,201.
Notice of Allowance from USPTO dated Aug. 4, 2021 for related U.S. Appl. No. 17/102,280.

* cited by examiner

ANALOG SYSTEM AND ASSOCIATED METHODS THEREOF

CROSS-REFERENCE TO RELATED ART

This patent application is a continuation of U.S. patent application Ser. No. 17/102,280, filed on Nov. 23, 2020, now U.S. patent Ser. No. 11/196,432, which is a continuation of U.S. patent application Ser. No. 16/788,201, filed on Feb. 11, 2020, now U.S. Pat. No. 10,855,298, which is a continuation of U.S. patent application Ser. No. 16/394,975, filed on Apr. 25, 2019, now U.S. Pat. No. 10,601,432; which is a continuation of Ser. No. 15/789,728 filed on Oct. 20, 2017, now U.S. Pat. No. 10,298,246; which is a continuation of U.S. patent application Ser. No. 15/614,977 filed on Jun. 6, 2017, now U.S. Pat. No. 9,831,883; which is a continuation of U.S. patent application Ser. No. 15/284,087 filed on Oct. 3, 2016, now U.S. Pat. No. 9,698,803. The disclosures of each priority application is incorporated herein by reference in their entirety.

BACKGROUND

Technical Field

This disclosure is related to analog to digital and digital to analog conversion.

Related Art

Wireless and wireline communications continue to grow today. Applications in wireless communications today may support multi-mode operation, utilize large portions of network bandwidth, for example, in UltraWideBand and 60-GHz-band systems, as well as attempt to re-use a licensed spectrum. To support this high-demand environment, a high dynamic range of operation for Analog to Digital Converters (ADCs) is desirable. Conventional ADCs however are inefficient because they may consume a significant portion of wireless communication chips power, for example, in some instances the ADCs may consume almost ⅓ or more of the total available power.

Wireline (or wired) communication systems also continue to demand increase in data throughput, for example, in Ethernet or next-generation cable modems. Wireline communications supporting the PAM4 (where PAM means "Pulse Amplitude Modulation") modulation standards are being proposed for high speed serial interconnect, network protocol link layers for example, Ethernet, InfiniBand, Serial Attached SCSI (Small Computer System Interface) and Fibre Channel. These applications are also driving demand for high resolution, high-speed, low power, and low cost integrated ADCs.

In today's system-on-chip (SoC) implementations, power consumption is one important performance and design parameter. The proliferation of mobile communication devices and distributed wireless sensor networks has necessitated development of power-efficient analog, radio-frequency and digital integrated circuits (ICs). Technology scaling may lower the cost of digital logic and memory and there is an incentive to implement high-volume baseband signal processing using the latest available process technology. There is significant interest in using transistors with minimum channel length and minimum oxide thickness to implement analog functions, because improved device transition frequency, allows for faster operations. However, device scaling may adversely affect other parameters relevant to analog designs. To achieve high linearity, high sampling speed, high dynamic range, with low supply voltages and low power dissipation in ultra-deep submicron CMOS (Complementary Metal-Oxide Semiconductor) technology is a major challenge.

Conventional ADC architectures attempt to achieve high conversions rates at undesirable high power consumption levels and conversion latency. Continuous efforts are being made to improve performance of ADCs at desirable power consumption levels.

BRIEF DESCRIPTION OF THE DRAWINGS

The various present aspects now will be discussed in detail with an emphasis on highlighting the advantageous features. These aspects depict the novel and non-obvious systems and methods for network devices shown in the accompanying drawings, which are for illustrative purposes only. The figures are not intended to depict scale. These drawings include the following figures, in which like numerals indicate like parts.

DETAILED DESCRIPTION

Figure 1:
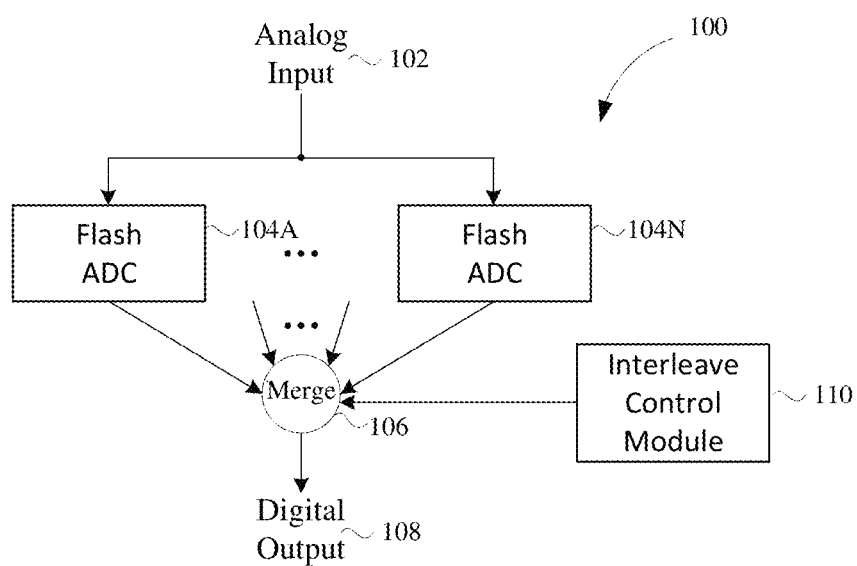
FIG. 1 is a high level block diagram of an interleaved inverter based flash analog to digital converter (ADC), according to one aspect of the present disclosure.

The following detailed description describes the present aspects with reference to the drawings. In the drawings, reference numbers label elements of the present aspects. These reference numbers are reproduced below in connection with the discussion of the corresponding drawing features.

As a preliminary note, any of the aspects described with reference to the figures may be implemented using software, firmware, hardware (e.g., fixed logic circuitry), manual processing, or a combination of these implementations. The terms "logic," "module," "component," "system" and "functionality," as used herein, generally represent software, firmware, hardware, or a combination of these elements. For instance, in the case of a software implementation, the terms "logic," "module," "component," "system," and "functionality" represent program code that performs specified tasks when executed on a processing device or devices (e.g., CPU or CPUs). The program code can be stored in one or more non-transitory, computer readable memory devices.

More generally, the illustrated separation of logic, modules, components, systems, and functionality into distinct units may reflect an actual physical grouping and allocation of software, firmware, and/or hardware, or can correspond to a conceptual allocation of different tasks performed by a single software program, firmware program, and/or hardware unit. The illustrated logic, modules, components, systems, and functionality may be located at a single site (e.g., as implemented by a processing device), or may be distributed over a plurality of locations.

In one aspect, an inverter-based analog to digital converter (ADC) is provided that uses a digital inverter circuit as a comparator. The inverter includes NMOS (n-Type Metal Oxide Semiconductor) and PMOS (p-Type Metal Oxide Semiconductor) device active at the same time providing a direct current path between a power rail and ground. A crowbar current is a large contributor to the total power consumption of conventional inverter based ADCs as many of the inverters will have both devices active for some period of time. In one aspect, the design described below in detail avoids this wasted power by the use of a dynamic discrete time architecture where an input signal is only connected to a gate of the NMOS devices after an output pre-charge cycle. Using a pre-charge circuit provides significant power reduction, as described below in detail.

In one aspect, an inverter based multi bit flash comparator is used to perform analog to digital conversion. A sample and hold circuit performs a programmable DC (direct current) level shift followed by a series of dynamic digital inverters; where enhancement mode NMOS devices have different gate voltage thresholds. The series of inverters produce a scrambled thermometer encoded output. As an example, more than $2^n$ inverters are used to provide increased manufacturing yield. The multi bit flash comparators may be time interleaved to increase conversion performance. The number of flash comparators that are time interleaved is determined by flash comparator performance and system performance needs.

In one aspect, the flash comparator scrambled thermometer output is provided as an input into a device selection block. The device selection block uses an optional temperature and voltage compensation logic and configuration information programmed during manufacturing testing, calibration and characterization to select and order the scrambled device outputs from the flash comparator to an ordered thermometer encoded output. During semiconductor wafer probe, the temperature and voltage are swept and changes to the configuration data are saved to modify comparator selection as the temperature and voltage vary throughout the operation of the system. The selection changes can be made seamlessly during a circuit pre-charge phase. As an example, the number of inputs into the device selection block may be greater than the number of outputs to improve product yield.

Furthermore, the ordered thermometer encoded output from the device selection block is input into an optional error detection and correction block, as described below. The error detection and correction block may be implemented by detecting multiple transitions within the thermometer encoded value to detect errors or use past values and/or extra redundant devices to limit the amount of worst case conversion error. The various aspects are not limited to any specific implementation.

In another aspect, a state machine is also provided that uses a multiplexer to consolidate/converge outputs from the time interleaved paths mentioned above, to produce a single output. The point for performing the convergence is chosen to allow individual flash comparators, device selections and error corrections logic while enabling sharing of the thermometer to one-hot encoding and the one-hot encoding to binary encoding logic. The amount of interleaving may be adjusted along with changes in the allowed conversion time to compensate for temperature and voltage variations. These parameters may be determined during manufacturing, test and stored at an on-chip, non-volatile memory.

In one aspect, a thermometer to one-hot encoding block is provided that examines the thermometer encoded value for a transition from an active to inactive state. This transition is likely to occur once in an error free thermometer encoded value. The output represents the position of the transition with only one active output value. The one-hot encoded value is then encoded into a final binary output value.

In one aspect, the flash comparator design of the present disclosure uses NMOS devices with a spread of voltage thresholds. The NMOS gate voltage threshold spread may be accomplished using charge tunneling, body effect offset, source resistance, device sorting or otherwise.

Charge tunneling is based on Fowler-Nordheim tunneling or hot electron injection methods depending on circuit design and device layout. In charge tunneling, a tunneled charge causes a floating-gate transistor to act like an electron gun. The excited electrons are pushed through and trapped on another side of a thin oxide layer, giving it a negative charge. The negatively charged electrons act as a barrier between a control gate and a floating gate. As charge is trapped in the gate oxide, the amount of gate voltage to activate a NMOS device channel is increased. The initial un-programmed device thresholds could be adjusted through process parameters to a very low threshold. The charge tunneling approach would have the advantage of a small size and low power as the amount of redundancy could be minimized reducing the total number of devices that are switching. The process may use a fabrication technology process used in a Flash memory process and not conventional digital process. In another aspect, a conventional digital or analog fabrication technology process is used for fabrication.

One of the side effects of deep submicron processes is the increased standard deviation in device gate voltage thresholds, which is undesirable for a conventional analog design. The ADC circuit of this disclosure exploits this normally undesirable attribute, which increases the statistical device threshold distribution.

Conventional analog layout techniques are normally deployed to attempt to more closely match MOS (metal-oxide semi-conductor) devices. In the present design described below, an increase in the standard deviation may be desirable to achieve the desired results.

A device sorting approach provides a design compatible with conventional deep submicron digital or analog processes. On the other hand there would be more redundant devices used to increase manufacturing yield leading to increased power consumption of a charge injection based threshold adjustment.

As the devices size decreases the standard deviation of the gate voltage threshold increases. In other words, process shrinks only improves the proposed design which is contrary to most other analog circuits.

In one aspect, additional redundant devices would be added to the design described below and during wafer probe testing, the devices with the closest threshold to a desired value are selected for each quantization step. The device selection and ordering would then be programed into a memory. If devices could not be selected for each quantization step, the die is marked as defective and discarded. This provided a balance between the added redundant devices and manufacturing yields.

In one aspect, the manufacturing yield benefits from error correction schemes that are implemented. There is an opportunity to examine thermometer bit encoding from a flash comparator before it is converted into one-hot encoding to provide error detection and correction information.

In one aspect, the system architecture described below using a digital inverter gate threshold quantization may compress an input signal range. A DC offset is added to the held analog input and the disclosed design provides scaling to compensate for input signal compression.

In one aspect, the manufacturing cost of a system is reduced by employing the adaptive design of this disclosure on a communications link, some of the tester characterization can be avoided and link training may be used to select an order of the inverter based flash comparators.

In one aspect, the disclosed system selects or programs more devices above and below a desired input voltage range to allow device selection to compensate for temperature or core voltage changes that occur after an initial device selection or programming process. In another aspect, the same techniques used for temperature and core voltage compensation may be used to extend a yield of devices that have failed the sorting process. It is noteworthy and without limitation, the term core voltage used throughout this specification means the voltage that is provided to power circuits in a system. Furthermore, the term temperature or system temperature is intended to mean the die temperature, i.e. the temperature that circuit elements of a system are subjected to during operation.

In one aspect, conversion time(s) may be decreased to compensate for increased temperature or increased to compensate for decreased temperature or vice versa depending on if the device threshold is inversely proportional or proportional to temperature respectively. In one aspect, the conversion time(s) may be decreased to compensate for increased core voltage or increased to compensate for decreased core voltage or vice versa, depending on if the device threshold is inversely proportional or proportional to core voltage, respectively. In yet another aspect, different conversion times may be used for different conversion bit ranges or a separate conversion time for each inverter compare function.

In one aspect, conventional analog design and layout practices for device matching are purposely violated to provide a wider device threshold distribution. The conventional analog design rules for device matching include device orientation, guard ring isolation, proximity to other devices or structures, build large components out of many identical units, use of stacked layout for large devices, use of common-centroid symmetry, consider boundary conditions, use of dummy devices if necessary, minimize parasitic series resistance by using as many contacts as possible, use stacked structures to realize large transistors to minimize diffusion capacitance, use multiple fingers to minimize gate resistance to minimize noise and maximize speed, maximize spacing between critical analog and digital components, minimize connection to critical nodes, minimize coupling or crossing between sensitive lines, use shields whenever space and speed allow and other well-known design and layout techniques.

In one aspect, the selection of a new set of devices may be selected up or down a device threshold curve.

In one aspect, the system of the present disclosure provides a digital offset value to be added or subtracted from an unadjusted digital output value to compensate for temperature and voltage changes that occur during system operation. These offset values may be stored in a memory that is addressed by the measured device temperature and core voltage.

In one aspect, a diode drop or fraction of a diode drop voltage is added to a sampled analog voltage during a sample and hold process. In another aspect, a programmable digital offset voltage value is added to the sampled analog voltage during the sample and hold process.

In one aspect, scaling of a sample and hold circuit is adjusted to provide a non-unity gain to adjust for temperature, core voltage or to increase manufacturing yield.

In one aspect, adjustments may be made to a device body voltage to adjust a device threshold voltage curve up or down to compensate for changes in temperature, core voltage or to increase manufacturing yield. Increases in body voltage cause an increase in voltage threshold for NMOS devices and vice versa. Decrease in body voltage cause an increase in voltage threshold for PMOS devices and vice versa.

In one aspect, source devices may be enabled or disabled to adjust a resister to move the device threshold curve up or down as needed. In another aspect, different values of source resistors selected to provide a wider range of device thresholds.

In one aspect, optimum device programming, characterization, compensation temperature and core voltage are selected to be different from the ambient temperature and nominal voltage to provide the best temperature and core voltage compensation.

In one aspect, source devices may be enabled or disabled to adjust the source resister to move the device threshold curve up or down as needed. In another aspect, a memory includes information used to modify the digital output 108 to compensate for changes in temperature and voltage.

System 100: With the foregoing in mind, systems and methods of the present disclosure will be described in more detail with respect to example aspects shown in the figures. It is understood that various other aspects of the disclosure are also disclosed and described herein and more fully describe the scope of the disclosure in various aspects.

In one aspect, FIG. 1 shows a system 100 that provides a time interleaved flash ADC without temperature compensation using flash ADC modules 104A-104N (may be referred to as flash ADC 104 or flash ADCs 104). The number of ADC modules 104A-104N may vary from system to system from 1 to any number.

In system 100, a continuous analog input 102 is converted to a discrete digital representation. The analog input 102 could represent a voltage, current, radiation level or any other continuous value input. Each flash ADC modules 104A-104N provides a partial digital output to a merge module 106 that is controlled by an interleave control module 110. The output from merge module 106 is the discrete digital output 108. Since the time used by a single flash ADC may be too long to perform the conversion to meet system needs, multiple flash ADCs 104A-104N are time interleaved to provide an aggregate increase in conversion rate performance, as described below in detail.

Figure 2A:
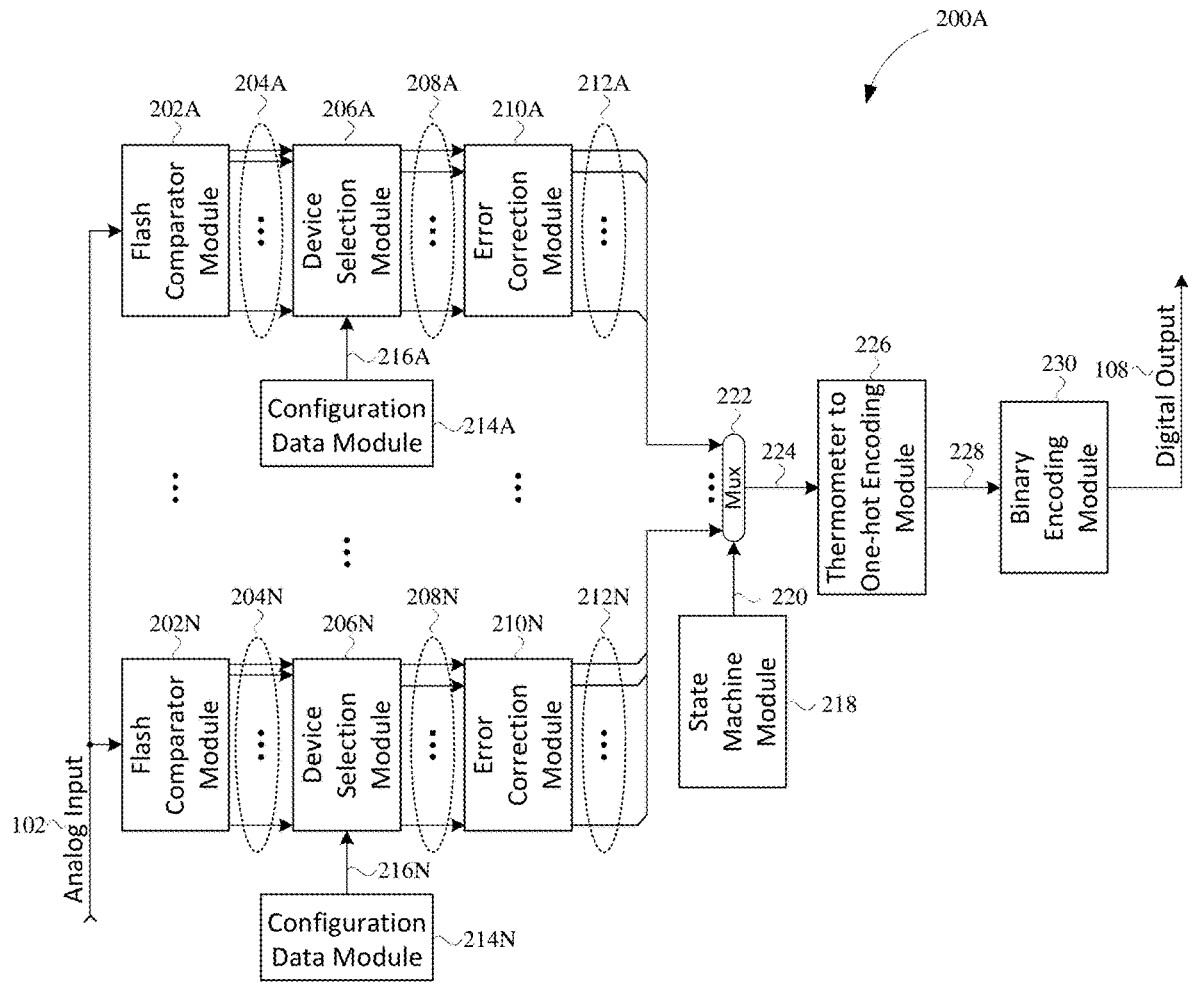
FIG. 2a is a block diagram of an interleaved inverter based flash ADC without temperature compensation, according to one aspect of the present disclosure.

System 200A: In one aspect, FIG. 2a is a block diagram of a system 200A that provides a time interleaved inverter based ADC, without temperature or core voltage compensation, according to one aspect of the present disclosure. System 200A includes a plurality of inverter based, flash comparator modules (may also be referred to as flash compare modules) 202A-202N that sample the analog input 102 and provide unordered output signals 204A-204N corresponding to each, inverter based flash comparators. In one aspect, the comparators within the flash comparator module 202A-202N are composed of a circuit based on a digital inverter gate. The number of flash comparator modules 202A-202N may vary from system to system from 1 to any other number and the various aspects disclosed herein are not intended to limit the number of time interleaved flash comparator modules to any specific number. Details of a flash comparator module 202A-202N are described below as Circuit Diagram 300A and Circuit Diagram 300B in FIG. 3a and FIG. 3b, respectively.

The unordered flash comparator module 202A-202N outputs the set of unordered output signals 204A-204N that represent outputs from each comparator. The number of unordered output signals 204A-204N will depend on the number of comparators within each flash comparator module 202A-202N. The number of comparators may depend on integrated circuit manufacturing transistor threshold distribution, number of bits of digital resolution, adjustability of transistor thresholds, circuit manufacturing yield goals, an amount and type of temperature compensation, a conversion rate and other factors. The various aspects described herein are not limited to any specific factor.

The set of unordered output signals 204A-204N are input into a device selection module 206A-206N. The device selection modules 206A-206N order the unordered output signals 204A-204N into uncorrected thermometer encoded signals 208A-208N. In one aspect, the device selection module 206A-206N may be composed of a set of multiplexers with output selection controls provided by configuration data 216A-216N from configuration data module 214A-214N. In one aspect, the process used to obtaining the selection configuration data, conversion time, DC offset value and other data is described below in the flow diagram of FIG. 7.

In one aspect, the selection of the unordered signals 204A-204N to form the uncorrected thermometer encoded signals 208A-208N may be implemented using manufacturing testing and optional programming. In another aspect, the process of selection of the unordered signals 204A-204N to form uncorrected thermometer encoded signals 208A-208N may be implemented by on die circuits allowing dynamic run time device selection. In another aspect, signal connection and ordering is added during the manufacturing process after initial device characterization testing. Configuration data 216A-216N from configuration data module 214A-214N may be used by the device selection module 206A-206N to transform the unordered signals 204A-204N into uncorrected thermometer encoded signals 208A-208N. In one aspect, the configuration data 216A-216N is stored in volatile such as SRAM, DRAM, Latches, Flip/Flops, logic gates or other memory types. In another aspect, the configuration data is stored in nonvolatile memory such as ROM, EPROM, EEPROM, Flash, phase change, disk, tape or other memory types. In yet another aspect, the configuration data is stored in fuses that are programmed during manufacturing test process. The fuses may be sampled upon power up or directly connected throughout the system operation. The various aspects described herein are not limited to any specific storage type.

The ordered uncorrected thermometer encoded signals 208A-208N represent the analog input 102. This set of signals may include redundant signals or extra signals. The redundant signals or extra signals may represent analog input 102 values in between the normal quantization digital steps. The nominal number of signals within the unordered signals 204A-204N and ordered uncorrected thermometer encoded signals 208A-208N is given by $2^n$ where n is the number of bits in the digital output 108. There are likely more unordered signals 204A-204N than ordered uncorrected thermometer encoded signals 208A-208N to provide manufacturing yield enhancements.

In one aspect, error correction modules 210A-210N accept the ordered uncorrected thermometer encoded signals 208A-208N and provides corrected thermometer encoded signals 212A-212N. The error correction modules 210A-210N may use various techniques to correct the errors. In one aspect, redundant signals are included in the thermometer encoded signals 208A-208N where these redundant signals provide a representation of the analog input 102 value that is in between a desired quantized value. In another aspect, redundant signals are included in the thermometer encoded signals 208A-208N where the redundant signals provide a representation of the analog input 102 value that is equal to other represented values. In yet another aspect, the thermometer encoded signals 208A-208N are examined for anomalies in the thermometer encoding. An example of such anomalies would be a thermometer encoded signal 208A-208N with a zero value followed by a higher ordered signal with a one value such as the following 8-bit sequence "00101111". An example circuit for error correction is described in more detail with respect to system 500 of FIG. 5. The corrected signal set 212A-212N contains $2^n$ again where n is the number of bits in the digital output 108.

The corrected signal set 212A-212N is provided to a Mux 222 that is controlled by a state machine 218 using multiplexer selection signals 220. The state machine module 218 controls the sequencing to achieve analog to digital converter time interleaving. In one aspect, the state machine module 218 processes are implemented using hardware sequencers. In another aspect, the state machine module 218 processes are implemented using software instructions that are machine executable. In yet another aspect, the state machine module 218 processes are implemented using a combination of hardware sequencers and software instructions. The state machine module 218 may provide controls, for example, clock signals, reset signals, pre-charge signals, convert signals, program address, program signal and other control signals. The state machine module 218 provides the multiplexer selection signals 220 to time multiplex the sets of thermometer encoded corrected signals 212A-212N.

The multiplexer 222 is used to time multiplex the different set of thermometer encoded corrected signals 212A-212N. There is a set of thermometer encoded corrected signals 212A-212N for each of the time interleaved ADC 104A-104N. The multiplexer 222 sequences through the multiple slower rate streams of thermometer encoded corrected signals 212A-212N to form a time multiplexed interleaved thermometer encoded full conversion rate signal 224 that represents a quantized version of the analog input 102.

Figure 5:
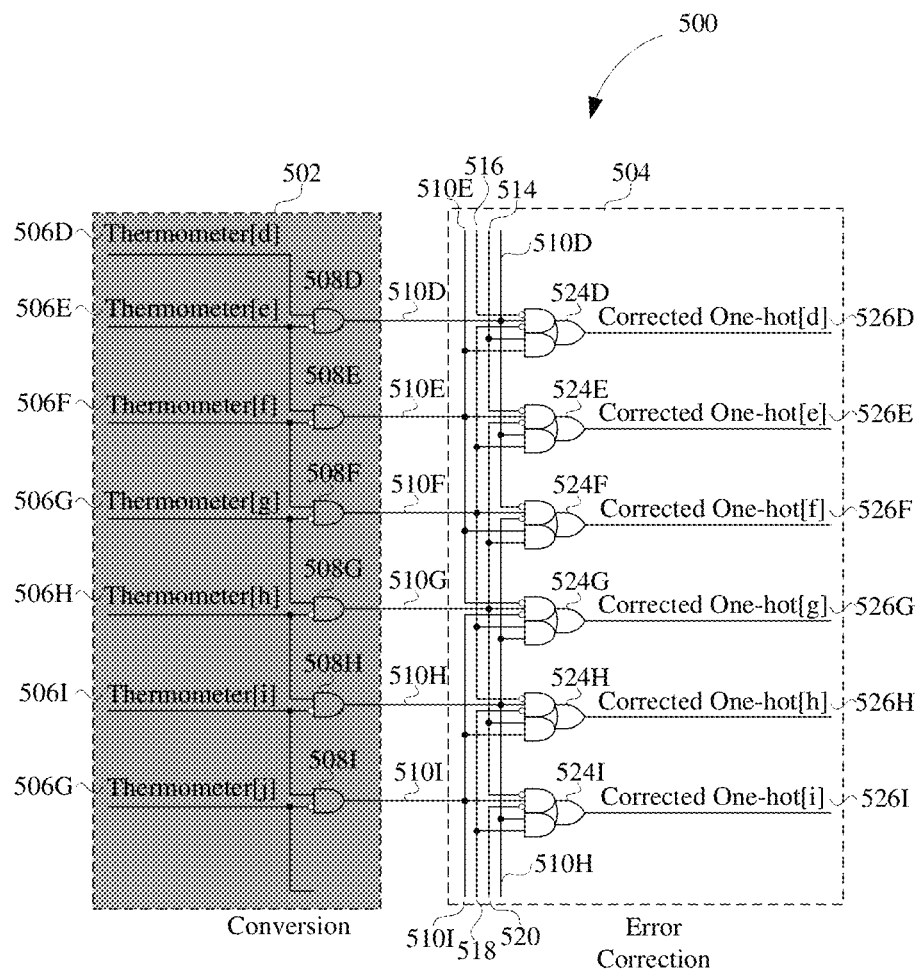
FIG. 5 is a circuit block diagram showing error correction, according to one aspect of the present disclosure.

Signals 224 are provided to a thermometer to one-hot encoding module 226 that outputs converted one-hot encoded signals 228. In one aspect, the thermometer to one-hot encoding module 226 also provides error correction functionality. One aspect of an example circuit of the thermometer to one-hot encoding module 226 is shown in FIG. 5.

The one-hot signals 228 are then provided to a binary encoding module 230 that converts the signal into a binary encoding that represents the digital output 108. The digital output 108 is a quantized digital representation of the analog input 102. The number of binary weighted signals may be represented by $\log_2$ of the number of one-hot encoded signals 228.

Figure 2B:
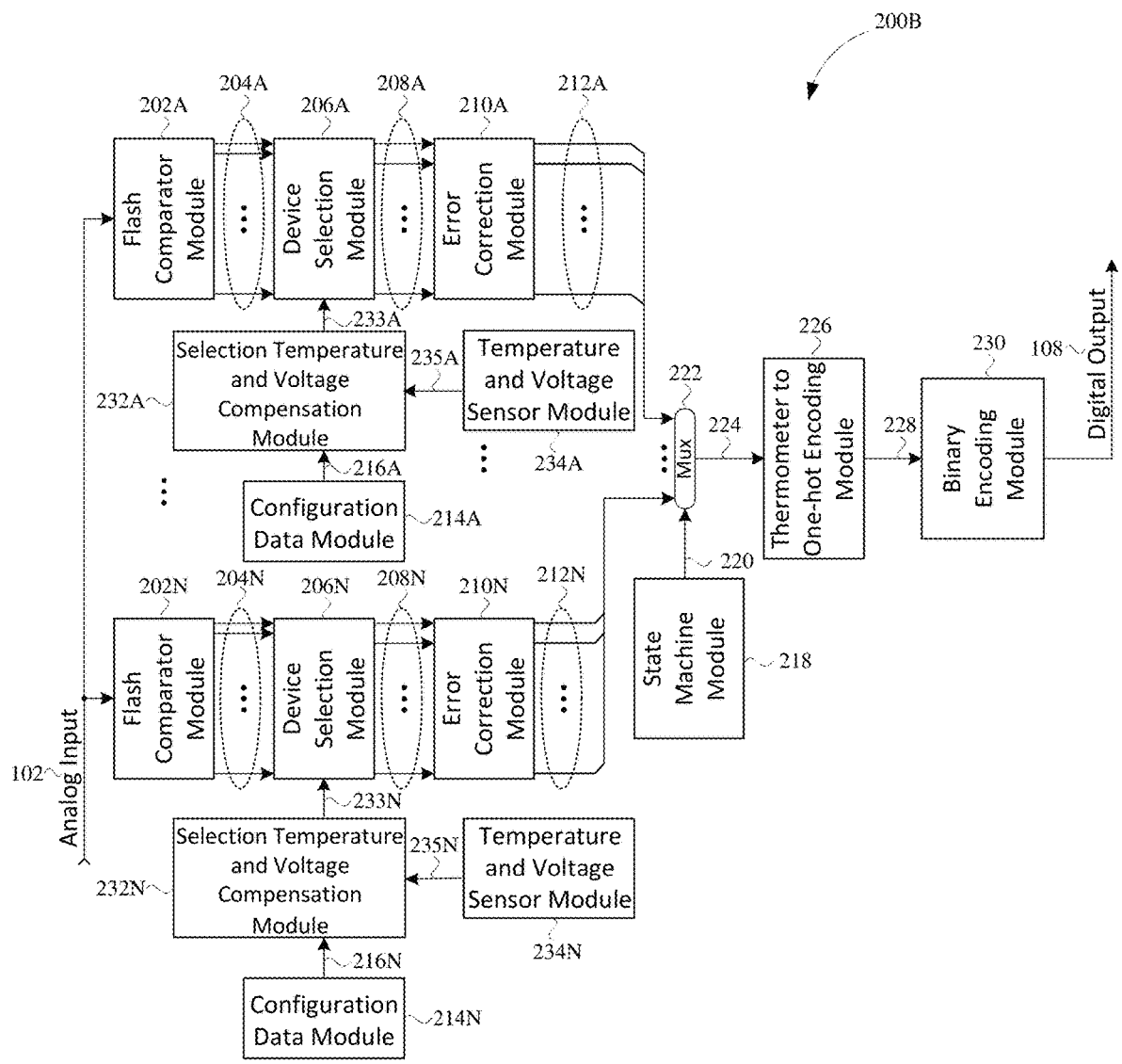
FIG. 2b is a block diagram of an interleaved inverter based flash ADC with device selection temperature compensation, according to one aspect of the present disclosure.

System 200B: FIG. 2b shows a system 200b that is a modified version of system 200a described above with respect to FIG. 2a, according to one aspect of the present disclosure for temperature and core voltage device threshold compensation. System 200b has components that may also be used in system 200a and for brevity sake, those components are not described again with respect to FIG. 2b.

System 200b provides a time interleaved flash ADC with device selection temperature and core voltage device threshold compensation. In one aspect, system temperature and core voltage is measured and used to modify device selection to compensate for device thresholds that may change with temperature and core voltage. System 200b includes temperature and voltage sensor module 234A-234N that measure system temperature and core voltage and output temperature and core voltage value signals 235A-235N that are provided to selection temperature and voltage compensation module 232A-232N (also referred to as module 232A-232N). The temperature and core voltage value signals 235A-235N provide a digital value representation of the system temperature and core voltage. In one aspect, each of the time interleaved ADC has a dedicated temperature and voltage sensor module 234A-234N. In another aspect, multiple time interleaved ADC share a temperature and voltage sensor module 234A-234N.

The selection temperature and voltage compensation module 232A-232N uses the information provided by the temperature and core voltage value signals 235A-235N to modify configuration data 216A-216N to form the temperature core voltage compensated configuration data 233A-233N. In one aspect, the process of the selection temperature and voltage compensation module 232A-232N is described in the flow of diagram of FIG. 9. In one aspect, the process for obtaining the temperature, voltage and other compensation data is described below in the flow diagram of FIG. 10.

In one aspect, the system 600 used for obtaining the temperature, voltage and other compensation data is described below with respect to FIG. 6.

Figure 2C:
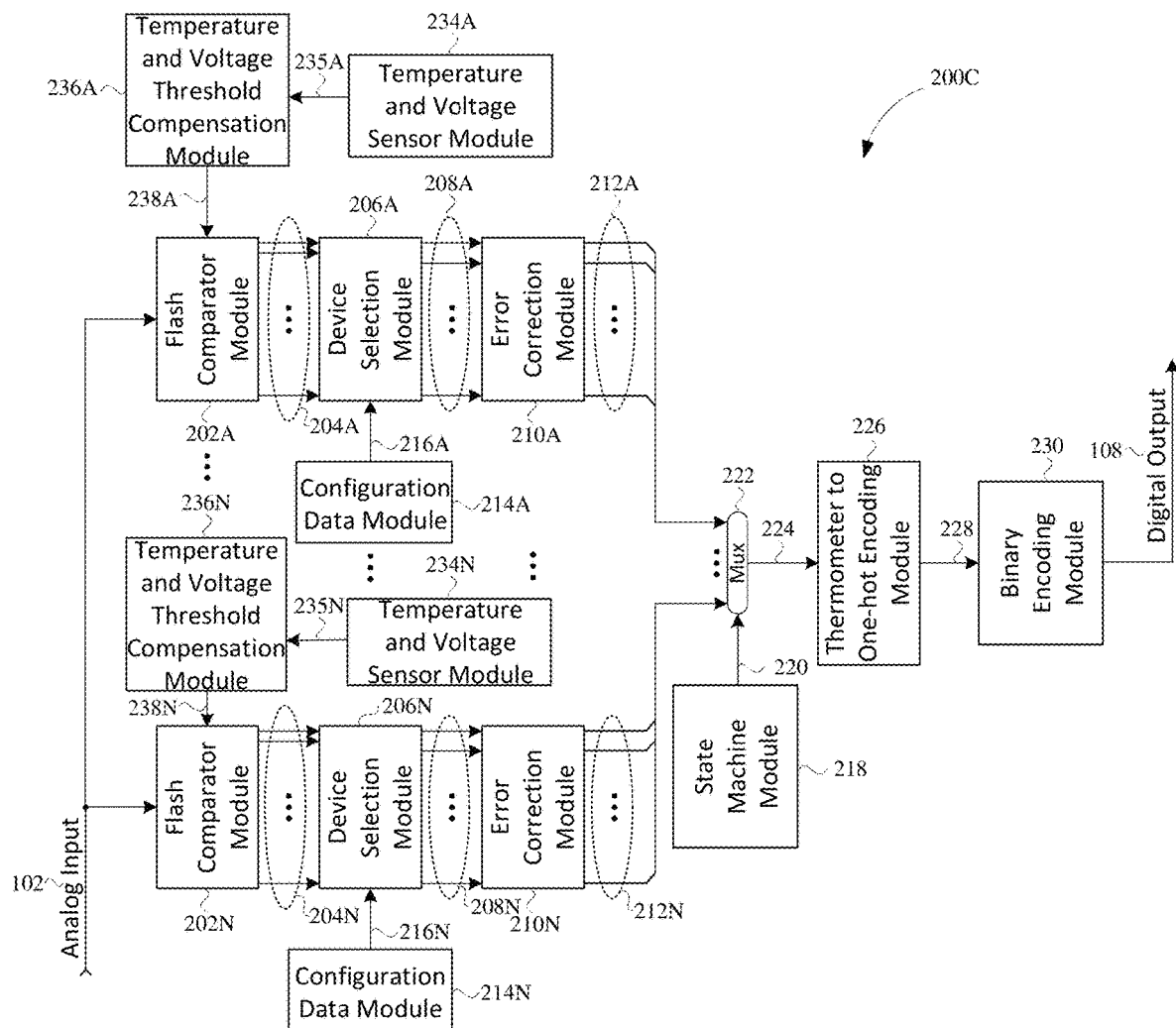
FIG. 2c is a block diagram of an interleaved inverter based flash ADC with threshold adjustment temperature compensation, according to one aspect of the present disclosure.

System 200C: FIG. 2c shows a system 200c that is a modified version of system 200a described above with respect to FIG. 2a for temperature and core voltage device threshold adjustment compensation, according to one aspect of the present disclosure. System 200c has components that may also be used in system 200a and 200b and for brevity sake, those components are not described again with respect to FIG. 2c.

In system 200c, the temperature and voltage threshold compensation module 236A-236N receives the system temperature and core voltage value signals 235A-235N from a temperature and voltage sensor module 234A-234N and uses signals 238A-238N to modify the conversion device voltage threshold of the sensing devices within the flash comparator module 202A-202N. In one aspect, each of the time interleaved ADC has a separate temperature and voltage sensor module 234A-234N. In another aspect, multiple time interleaved ADCs share a temperature and voltage sensor module 234A-234N.

In one aspect, the device voltage threshold is adjusted by changing the device body voltage. In another aspect, the device voltage threshold is adjusted by switching in different source resisters. A source resistor is a device connected between the conversion device source terminal and ground potential for NMOS devices and a voltage potential for PMOS devices. In yet another aspect, the device voltage threshold is adjusted by tunneling charge into or out of the device gate oxide. In one aspect, the process used to adjust the device threshold as described below in the flow diagram of FIG. 8a and FIG. 8b. In another aspect, the device voltage threshold is adjusted by changing a source resistor value. In one aspect, the source resistor value is changed by trapped charge. In another aspect, a MOS device is used as a source resistor. In another aspect, a source resistor MOS device is adjusted to compensate for temperature and core voltage changes and increase manufacturing yield by changing the gate voltage. In another aspect, the source resistor value is changed by a resistor adjusting circuit 401 shown in FIG. 4 and described below in detail. In one aspect, the temperature, voltage and other compensation data is obtained using the process flow of FIG. 10. In one aspect, the system 600 used for obtaining the temperature, voltage and other compensation data is described below with respect to FIG. 6.

Figure 2D:
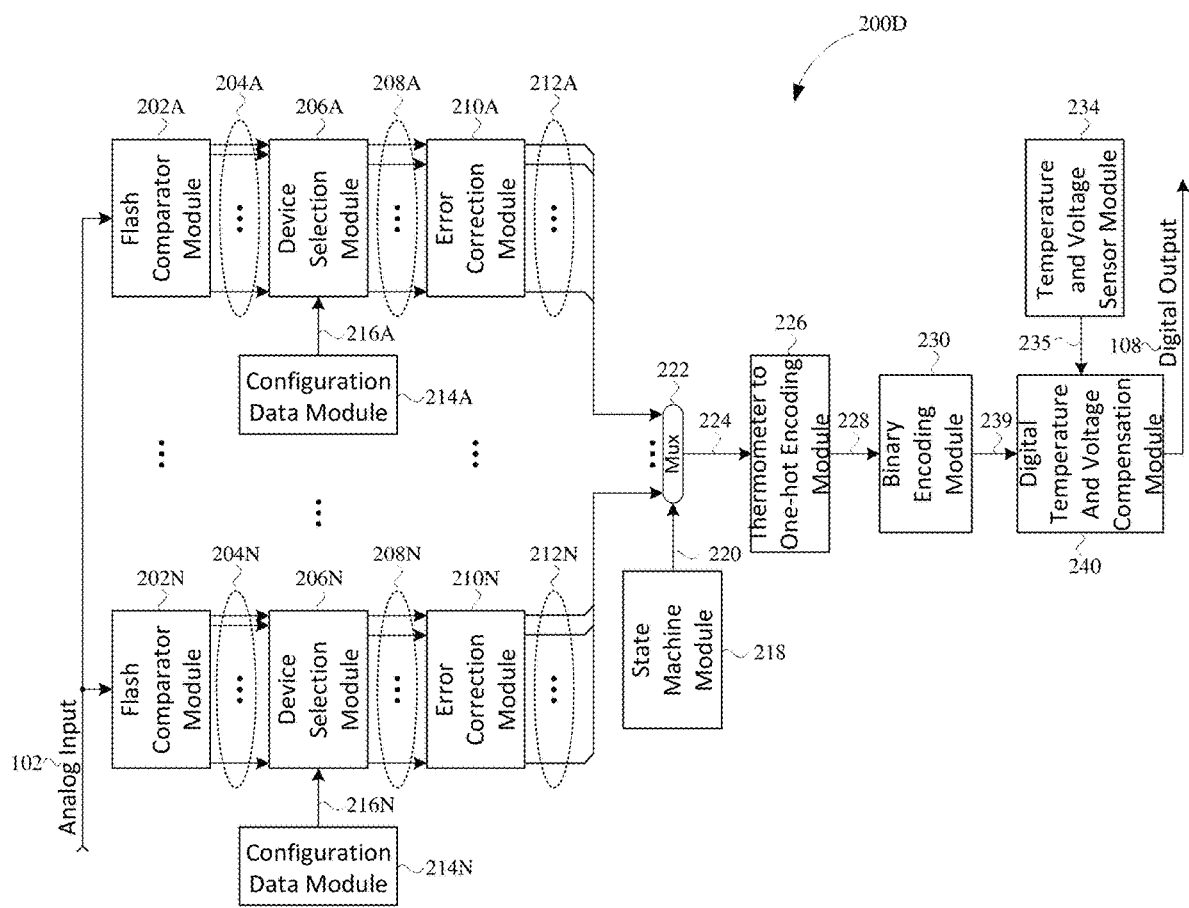
FIG. 2d is a block diagram of an interleaved inverter based flash ADC with binary output value adjustment temperature compensation, according to one aspect of the present disclosure.

System 200D: FIG. 2d shows system 200d that provides yet another example of a time interleaved flash ADC with digital temperature and core voltage device threshold compensation, according to one aspect of the present disclosure. System 200d has components that may also be used in system 200a and 200b and for brevity sake, those components are not described again with respect to FIG. 2d.

System 200d includes a digital temperature and voltage compensation module 240 that modifies uncompensated digital signals 239 to form the digital output 108. The temperature and voltage sensor module 234 measures the die temperature and core voltage and provides temperature and core voltage information 235 to the digital temperature and voltage compensation module 240. In one aspect, the digital temperature compensation is performed by adding or subtracting compensation data from the uncompensated digital signals 239. In one aspect, the digital output 108 is modified for error correction. In one aspect, the temperature, voltage and other compensation data is obtained using the process of FIG. 10. In one aspect, the system 600 used for obtaining the temperature, voltage and other compensation data is described below with respect to FIG. 6. As an example, the compensation data may be stored in SRAM, ROM, EPROM, EEPROM, Flash, Latches, Flip/Flops, Disk, DRAM, Phase Change Memory, Tape or any other storage medium.

Figure 2E:
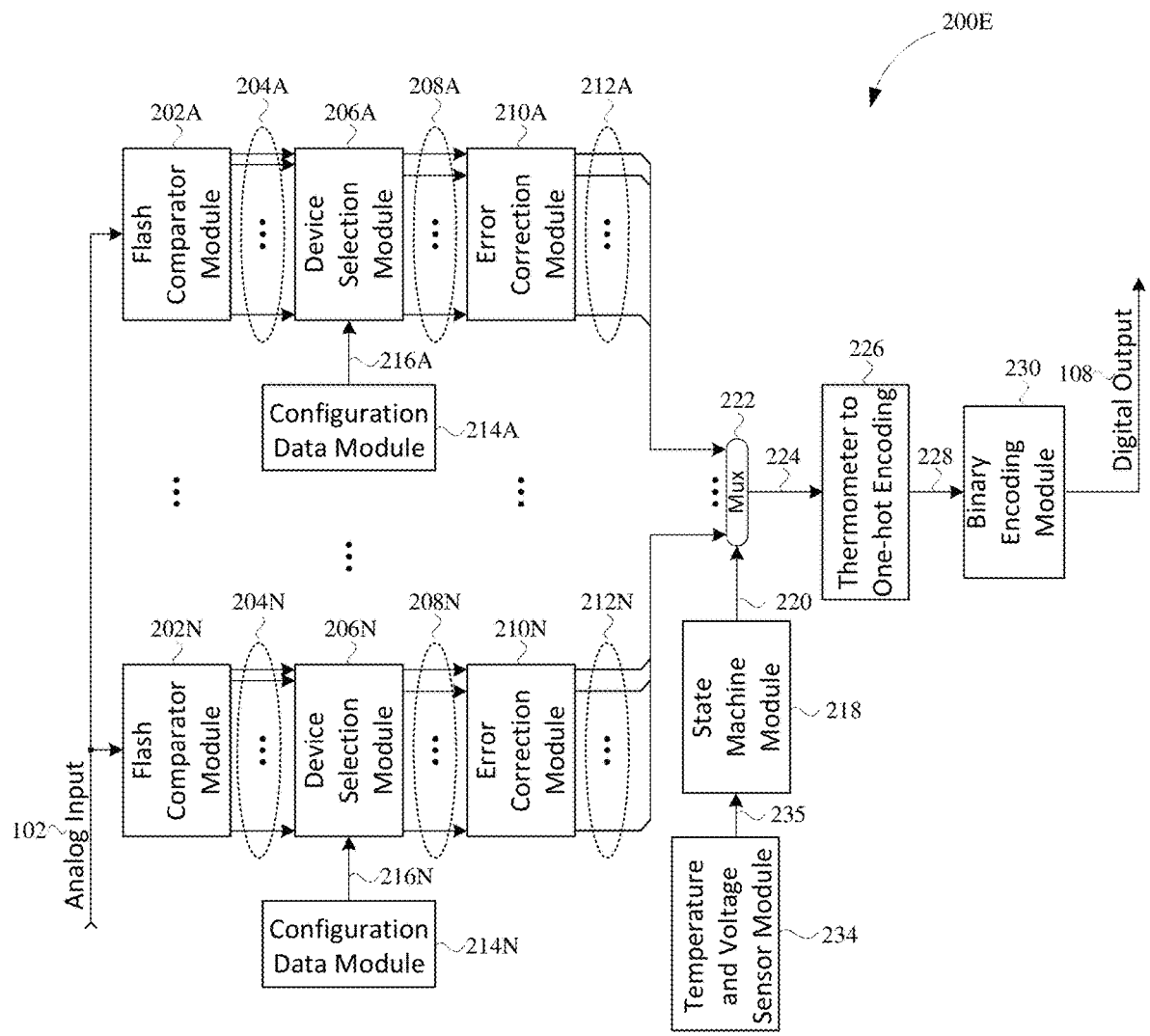
FIG. 2e is a block diagram of an interleaved inverter based flash ADC with conversion time adjustment temperature compensation, according to one aspect of the present disclosure.

System 200E: FIG. 2e shows system 200e, yet another example, of a time interleaved flash ADC with conversion time temperature and core voltage device threshold compensation, according to one aspect of the present disclosure. System 200e has components that may also be used in system 200a and 200b and for brevity sake, those components are not described again with respect to FIG. 2e.

In system 200e, the temperature and voltage sensor module 234 measures the die temperature and core voltage and provides temperature and core voltage information 235 to the state machine module 218. This temperature and core voltage information 235 may also be provided to the flash compare module 202A-202N. In one aspect, each comparator within the flash compare module 202A-202N uses an independent conversion time based on device parameters and temperature and core voltage compensation information 235. Due to the different conversion times, the unordered signal set 204A-204N may be held by the flash comparator module 202A-202N or another module if there is a significant difference between a fastest and slowest conversion time after considering temperature compensation conversion time adjustments. In one aspect, the number of ADCs 104A-104N time interleaved is adjusted to match the slowest temperature adjusted conversion times of the comparators within the flash comparator module 202A-202N with expected system performance. In one aspect, the conversion time is adjusted to match device process parameters to a desired analog to digital conversion transfer function. In one aspect, the conversion time is adjusted to match the desired DC offset while providing the desired analog to digital conversion transfer function.

Figure 3A:
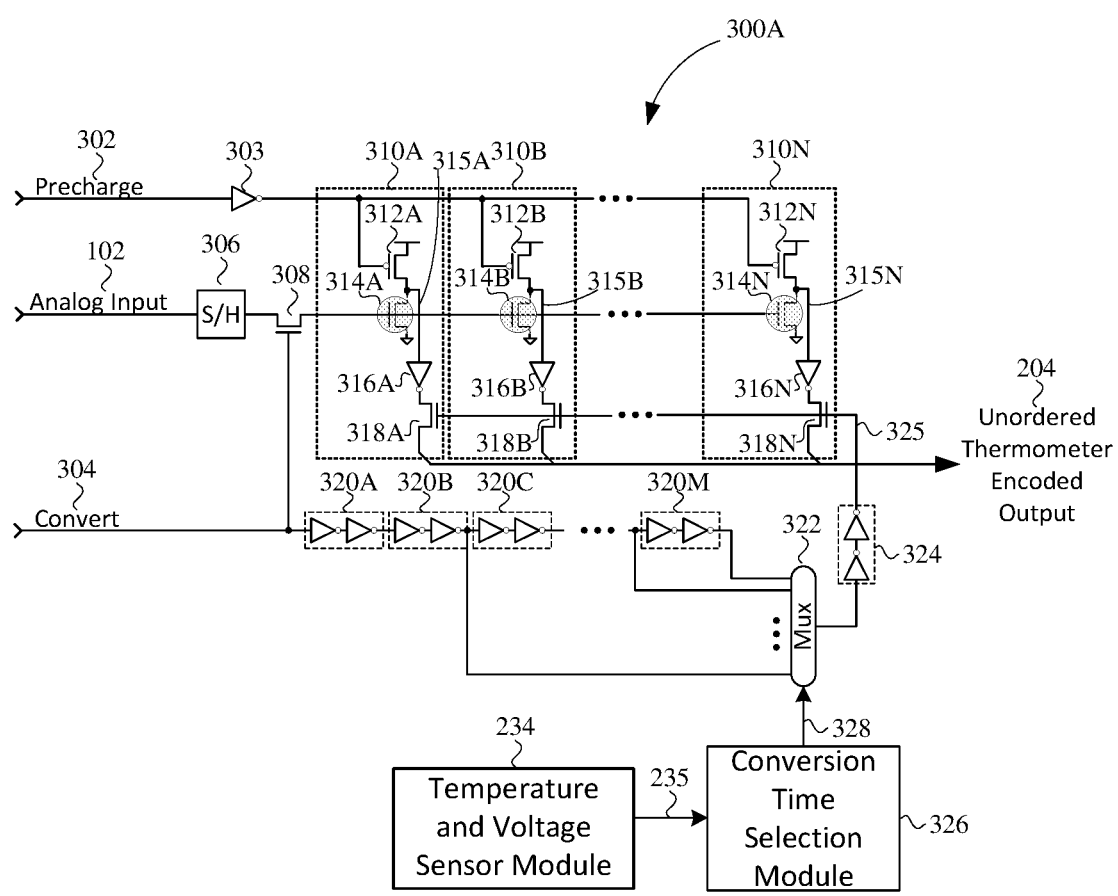
FIG. 3a is a circuit block diagram showing an inverter based flash ADC with device selection, according to one aspect of the present disclosure.

Circuit 300A: FIG. 3a shows a circuit diagram 300a for a flash comparator module 202A-202N depicting un-programmable device threshold selection using inverter based comparators 310A-310N, in one aspect of the present disclosure. A dynamic circuit architecture is depicted for illustrative purposes and is not intended to limit the disclosure to any one type of inverter architecture. The adaptive aspects described herein are not limited to any specific number of inverter based comparators 310A-310N. The number of inverter based comparators 310A-310N may vary from system to system from 1 to any other number. The number of inverter based comparators 310A-310N in a system depends on the number of bits of resolution desired in the digital output 108, the device threshold distribution of the fabrication process, the adjustability of the device threshold, the system operating temperature range, the system core voltage operating range, the analog input 102 voltage swing, the amount of and the method of used error correction, the system die size target, the system cost target, the manufacturing system yield target and other factors. In one aspect, the inverter based comparators 310A-310N are realized using a complementary architecture where the NMOS and PMOS gates are controlled by the same or similar signal. In another aspect, the inverter based comparators 310A-310N are realized using a dynamic architecture where the NMOS and PMOS gates are not controlled by the same or similar signal.

A pre-charge signal 302 via inverter 303 starts a conversion cycle by pre-charging an internal node 315A-315N of each of the inverter based comparators 310A-310N, for example, to a logic "1" value through pre-charge devices 312A-312N. The internal node 315A-315N value is inverted by digital inverters 316A-316N to provide a logic "0" value on the unordered thermometer encoded output 204 for all inverter based comparators. Pre-charge signal 302 is deactivated followed by the activation of a convert signal 304. The convert signal 304 enables the analog input 102 captured by the sample and hold circuit 306 to pass to the gate inputs of conversion devices 314A-314N through pass gate switch 308. In one aspect, the function provided by an optional pass gate switch device 308 is included within the sample and hold module 306.

In one aspect, the convert signal 304 is optionally used to start a delay line signal pulse through inverter pairs 320A-320M. This aspect is not intended to limit the number of inverter pairs 320A-320M to any specific number. The number of inverter pairs 320A-320M may vary from system to system from 1 to any number. The number of inverter pairs 320A-320M in the system will depend on the minimum and maximum comparator processing time over a desired system operating temperature and core voltage range. In one aspect, the inverter pairs 320A-320M may be used to provide compensation for temperature and core voltage variations as the system temperature and core voltage varies. The conversion time selection module 326 receives temperature and core voltage data 235 from temperature and voltage sensor module 234 and uses this temperature and core voltage data 235 to adjust the selection signals 328 to adjust the corresponding delay between the convert signal 304 and a sample signal 325. This delay is the conversion time of the ADC. In one aspect, the delay between the convert signal 304 and the sample signal 325 is provided by a series sequence of digital logic gates, counter, shift register, wire delay, digital circuit, microprocessor, state machine, capacitive circuit, resistive circuit or other circuit mechanism.

In another aspect, conversion time function as defined is the time delay between the assertion of the convert signal 304 and the assertion of the sample signal 325 is provided as part of the time interleaving process. In yet another aspect, the conversion time may vary between the analog to digital converters that are time interleaved. The time intervals of the time interleaving may be compressed or stretched to match the device selection and to compensate for device temperature and core voltage variations. The digital values could be latched to smooth the time interval changes from the digital output 108.

In one aspect, circuits and devices are designed to provide offsetting temperature and core voltage variation cancellation as the threshold of the conversion device 314A-314N decreases circuit components including possibly the conversion devices 314A-314N slow down to cancel these effects and vice versa. At the end of the delay line propagation inverter pair 324 is used to drive gating devices 318A-318N that connect the outputs from inverters 316A-316N to the set of unordered thermometer encoded output signals 204. In another aspect, the inverter pair 324 is optional and the sample gate devices 318A-318N are driven directly by a multiplexer 322. In yet another aspect, the outputs for the inverters 316A-316N directly provide the set of unordered for thermometer encoded output signals 204. The conversion time selection module 326 adjust the amount of time delay between the activation of the convert signal 304 and the sampling of the inverter based comparators 310A-310N through inverters 316A-316N and gate devices 318A-318N.

The output signal 328 from the conversion time selection module 326 provides the selection input for multiplexer 322. The multiplexer 322 selects different signal paths that contain varying number of inverter pairs 320A-320M each inverter pair 320A-320M adding a small amount of signal delay leading to variation in the total signal propagation delay. The amount of signal delay is selected to match a desired processing time of the inverter based comparators 310A-310N. The sample and hold circuit 306 samples the analog input 102 and holds the sampled analog value through the desired conversion time. In one aspect, the sample and hold circuit 306 performs load amplification to drive the added capacitance of the gate inputs of conversion devices 314A-314N. In one aspect, the sample and hold module 306 may include a direct current (DC) voltage offset to move the sampled analog input 102 within the threshold voltage range of the conversion devices 314A-314N. In one aspect, the DC voltage offset is programmable and may use a different value for each flash comparator module 202A-202N. In another aspect, gain scaling is used to compensate for the input voltage compression that may be caused by adding the DC offset voltage. The conversion devices 314A-314N will be operating in one of three regions of operation including cutoff, linear or saturation depending on the device fabrication parameters and the analog input 102 value.

Circuit diagram 300A depicts the use of metal oxide semiconductor field-effect transistor (MOSFET) devices for illustrative purposes and is not intended to limit the devices used to any type of device, device technology or manufacturing process technology.

Figure 3B:
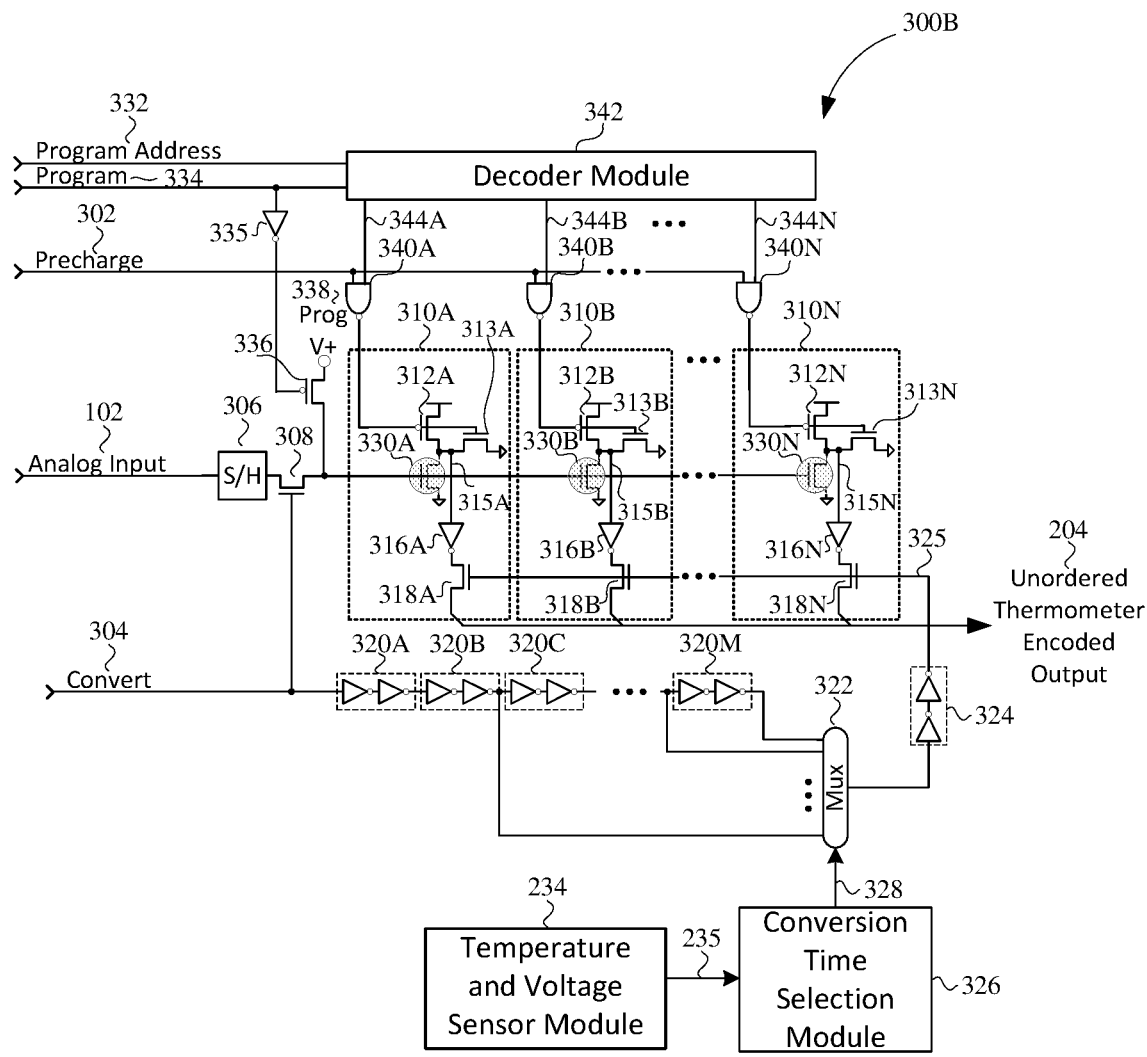
FIG. 3b is a circuit block diagram showing an inverter based flash ADC with threshold programming, according to one aspect of the present disclosure.

Circuit 300B: FIG. 3b shows a circuit diagram 300b of flash compare module 202A-202N depicting conversion devices with programmable device thresholds. Circuit 300b includes various components that are also used in circuit 300a and for brevity are not described again.

Circuit 300b includes a plurality of programmable conversion devices 330A-330N similar to conversion devices 314A-314N of FIG. 3a, except for devices 330A-330N, the device threshold is adjustable for example, by using charge tunneling techniques. In another aspect, the threshold of the programmable conversion device 330A-330N is adjustable by changes to a device body bias value. In yet another aspect, the threshold of the programmable conversion device is 330A-330N is adjusted by changes to a source resistance as described below with respect to FIG. 4.

In FIG. 3b, a program address signal 332 is decoded by a decoder module 342 to select one of the programmable conversion devices 330A-330N for threshold adjustment. A program signal 334 controls the conversion device 330A-330N threshold adjustment operation when asserted. An optional inverter 335 inverts the active level of the program signal 334 when it is input into a gate input of the PMOS programming voltage device 336. The programming voltage device 336 is used to reply a program in voltage 338 to a gate terminal of the programmable conversion device 330A-330N. A plurality of NAND gates 340A-340N are used to drive the pre-charge devices 312A-312N and the drain pull-down device 313A-313N.

During threshold adjustment, the decoder module 342 uses program address signals 332 and the program signal 334 to select which output signals 344A-344N to drive to a logical "1" or logical "0" value. The pre-charge signal 302 is held active (logical "1") during threshold adjustment. When the decoder module 342 is performing threshold adjustment, output signal 344A-344N are asserted to a logical "0" for the inverter based comparators 310A-310N that include the selected programmable conversion devices 330A-330N. The NAND gate 340A-340N that corresponds to the selected programmable conversion device 330A-330N provides an active high signal to pre-charge device 312A-312N and drain pulldown device 315A-315N. The corresponding pre-charge device 312A-312N is forced inactive and the corresponding drain pulldown device 313A-313N is forced active bringing the corresponding internal node 315A-315N to the ground potential. This large voltage difference between the selected gate voltage and the drain terminal that is connected to the internal node 315A-315N causes a tunneling current to flow allowing charge to be trapped in the device oxide or floating gate. The process is reversed to remove charge from a device.

The non-selected inverter based comparators 310A-310N have their corresponding pre-charge devices 312A-312N active and their drain pull-down devices 313A-313N inactive resulting in a corresponding internal node 315A-315N voltage that prevents the flow of a significant amount of tunneling current allowing the threshold of the corresponding programmable conversion device 330A-330N to remain virtually unchanged. Adding negative charge (electrons) into the gate oxide increases the programmable conversion device 330A-330N threshold. There is analogous process for removing charge to adjust the threshold of the programmable conversion device 330A-330N. Removing charge (remove electrons) from the gate oxide or floating gate decreases the programmable conversion device 330A-330N threshold.

Circuit diagram 300B depicts the use of charge tunneling to adjust the threshold of the programmable conversion devices 330A-330N for illustrative purposes and is not intended to limit the method used to adjust the device threshold. Furthermore, circuit diagram 300B depicts the use of metal oxide semiconductor field-effect transistor (MOSFET) devices for illustrative purposes and is not intended to limit the devices used to any type of device, device technology or manufacturing process technology.

Figure 4:
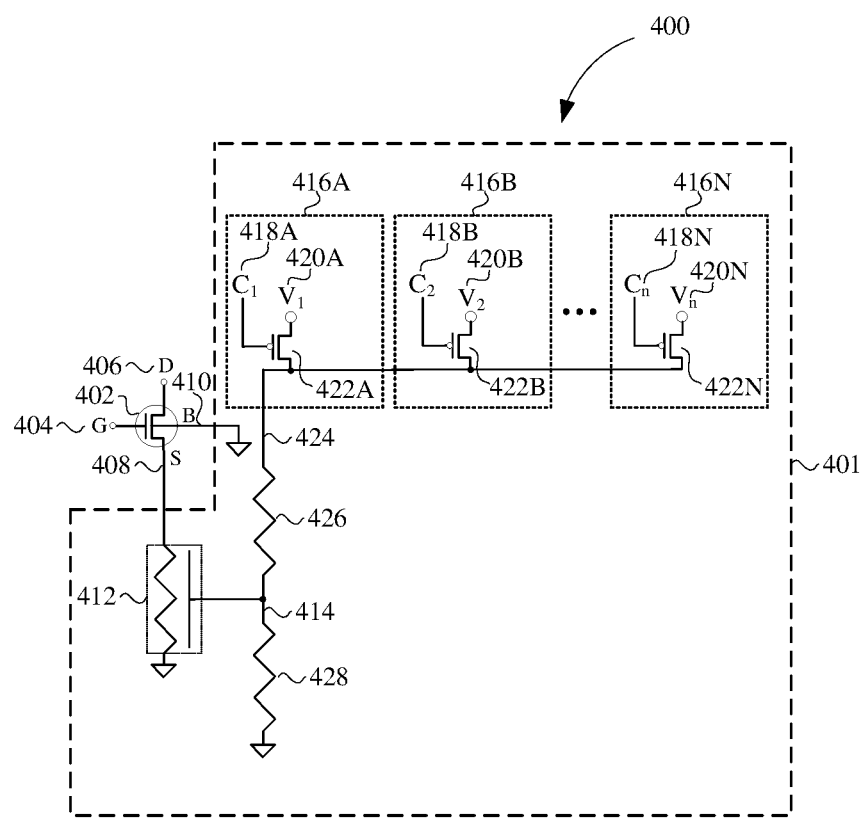
FIG. 4 is a circuit diagram showing a device threshold resister adjustment, according to one aspect of the present disclosure.

System 400: FIG. 4 shows a system 400 using an adjustable source resister to modify a conversion device 402 threshold. An adjustment circuit 401 is shown separately from the NMOS conversion device 402 whose threshold is modified. In one aspect, the NMOS conversion device 402 is a four terminal device with a gate terminal 404, a drain terminal 406, a source terminal 408 and a body terminal 410. The body terminal 410 is also referred to as the substrate terminal. Typically the body terminal 410 is connected to ground (VSS) for NMOS devices and VDD for PMOS devices. The device threshold of the NMOS conversion device 402 changes with varying voltage difference between the source terminal 408 and the body terminal 410. As the voltage between the source terminal 408 and the body terminal 410 is increased the gate voltage threshold of a NMOS conversion device 402 increases. The opposite is true for a PMOS device; an increase in the source terminal 408 to body terminal 410 voltage results in a decrease in the device gate threshold voltage.

The NMOS conversion device 402 has an adjustable resistor 412 connected between its source terminal 408 and ground (VSS). As charge current passes through the NMOS conversion device 402 from drain terminal 406 to the source terminal 408, it also passes through the adjustable resister 412 before reaching the circuit ground (VSS). As charge current passes through the adjustable resister 412 a voltage is generated across the adjustable resister 412 that is proportional to the resistance. This generated voltage raises the voltage of the source terminal 408 to body terminal 410 voltage resulting in an increased threshold voltage for the NMOS conversion device 402. As the resistance of the adjustable resistor 412 is increased so is the gate threshold voltage of the NMOS conversion device 402 and vice versa.

In one aspect, the adjustable resistor 412 is a MOS resistor consisting of a diffusion area covered by an insulator and a conducting layer above the insulator. The conducting layer is defined as adjusting terminal 414. Optional resistors 426 and 428 form a voltage divider of the voltage provided to the adjusting terminal 414, which is a function of the ratio of resistors 426 and 428 and the voltage on voltage node 424. In one aspect, resistors 426 and 428 are optional and voltage node 424 is connected directly to adjusting terminal 414.

Different voltage values for voltage node 424 are achieved by activating different voltage sources 416A-416N. Each voltage source may be connected to a different voltage supply value. The voltage source 416A-416N is composed of a corresponding control signal 418A-418N, a voltage supply 420A-420N and a gate device 422A-422N. During operation, one of the control signals within the voltage source 416A-416N is asserted effectively connecting the corresponding voltage supply 420A-420N to voltage node 424 bringing the voltage node 424 equal to the corresponding voltage supply for 420A-420N. In one aspect, the voltage sources 4126A-416N are shared by multiple voltage nodes 424 associated with different NMOS conversion devices 402.

As the voltage is changed on the adjusting terminal 414, conducting charges are increased or decreased in the diffusion and channel areas, if present, depending on the voltage applied to the adjustment terminal 414. In one aspect, multiple device channels are constructed below the insulating layer of the adjustable resistor 412 and within the diffusion layer of the adjustable resistor 412. These channels form areas of increased resistance that change resistance with the application of different voltages to the adjustment terminal 414.

In one aspect, the resistance of the adjustable resistor 412 is modified by the use of charge tunneling process in to an oxide to provide a non-volatile adjustment. During the charge tunneling process electrical charge is tunneled into or out of the insulating layer over the diffusion and channel areas of the adjustable resistor 412. In one aspect, the adjustable resistor 412 is a depletion mode MOSFET.

In another aspect, the adjustment circuit 401 is replaced by a group of different valued resistors and switches to connect different resistance values between source terminal 408 and ground (VSS). In another aspect, a phase change element is used to provide the adjustable source resistor to adjust the conversion device threshold. In yet another aspect, a magneto-resistive element is used to provide the adjustable source resistor to adjust the conversion device threshold.

Circuit diagram 400 depicts the use of N-type metal oxide semiconductor field-effect transistor (MOSFET) devices for illustrative purposes and is not intended to limit the disclosure to any type of device, device technology or manufacturing process technology.

System 500: FIG. 5 shows a system 500 for an error correction circuit that may be adaptively used in the error correction module 210A-210N, according to one aspect of the present disclosure. This circuit of system 500 is a middle segment of a larger circuit. The middle segment is used for illustrative purposes and is not intended to limit the size of the data being corrected.

In one aspect, system 500 includes a conversion section 502 that receives un-corrected thermometer encoded data 506D-506J (similar to the ordered signal set 208A-208N described above) provides it to AND gates 508D-508I. The most significant input of AND gates 508D-508I is inverted. For example, the inputs into AND gate 508D is a positive copy of signal 506D and an inverted copy of signal 506E.

The output from AND gate 508D-508I is uncorrected one-hot encoded data 510D-510I. The one-hot encoded data 510D-510I may contain errors. An example of an error would be is more than one of the one-hot encoded signals 510D-510I contained a positive value (logic '1').

Each output of one-hot encoded data 510D-510I is connected to five AND-OR gates 524D-524I except at the start and end of the data sequence, where the unavailable inputs would be set inactive as they are input into the AND-OR gates. A signal 514 is driven by an AND gate similar to AND gates 508D-508I, but represents an uncorrected one-hot encoded data bit with one less bit of significance than signal 510D. As an example, signal 516 is driven by an AND gate similar to AND gates 508D-508I, but represents an uncorrected one-hot encoded data bit with two less bits of significance than signal 510D. Signal 518 is driven by an AND gate similar to AND gates 508D-508I, but represents an uncorrected one-hot encoded data bit with one more bit of significance than signal 510I. Signal 520 is driven by an AND gate similar to AND gates 508D-508I, but represents an uncorrected one-hot encoded data bit with two more bits of significance than signal 510I.

In one aspect, the AND-OR gate 524D-524I detects an error condition and corrects it. For example if uncorrected one-hot encoded data 510D-510I is represented by the binary value "010100" the corrected one-hot encoded data 526D-526I would be represented by the binary value "000100". In another aspect, the error correction circuit 504 produces a corrected one-hot encoded data 526D-526I represented by the binary value "010000". The use of any particular logic gate is for illustrative purposes and is not intended to limit the use of any logic gate type.

System Block Diagram 600: FIG. 6 shows a block diagram of a manufacturing test and programming system 600, used according to one aspect of the present disclosure. System 600 may be used to evaluate, test, characterize calibration and optionally program an ADC of the present disclosure. System 600 is not intended to limit the disclosure and actual system components may vary.

Figure 6:
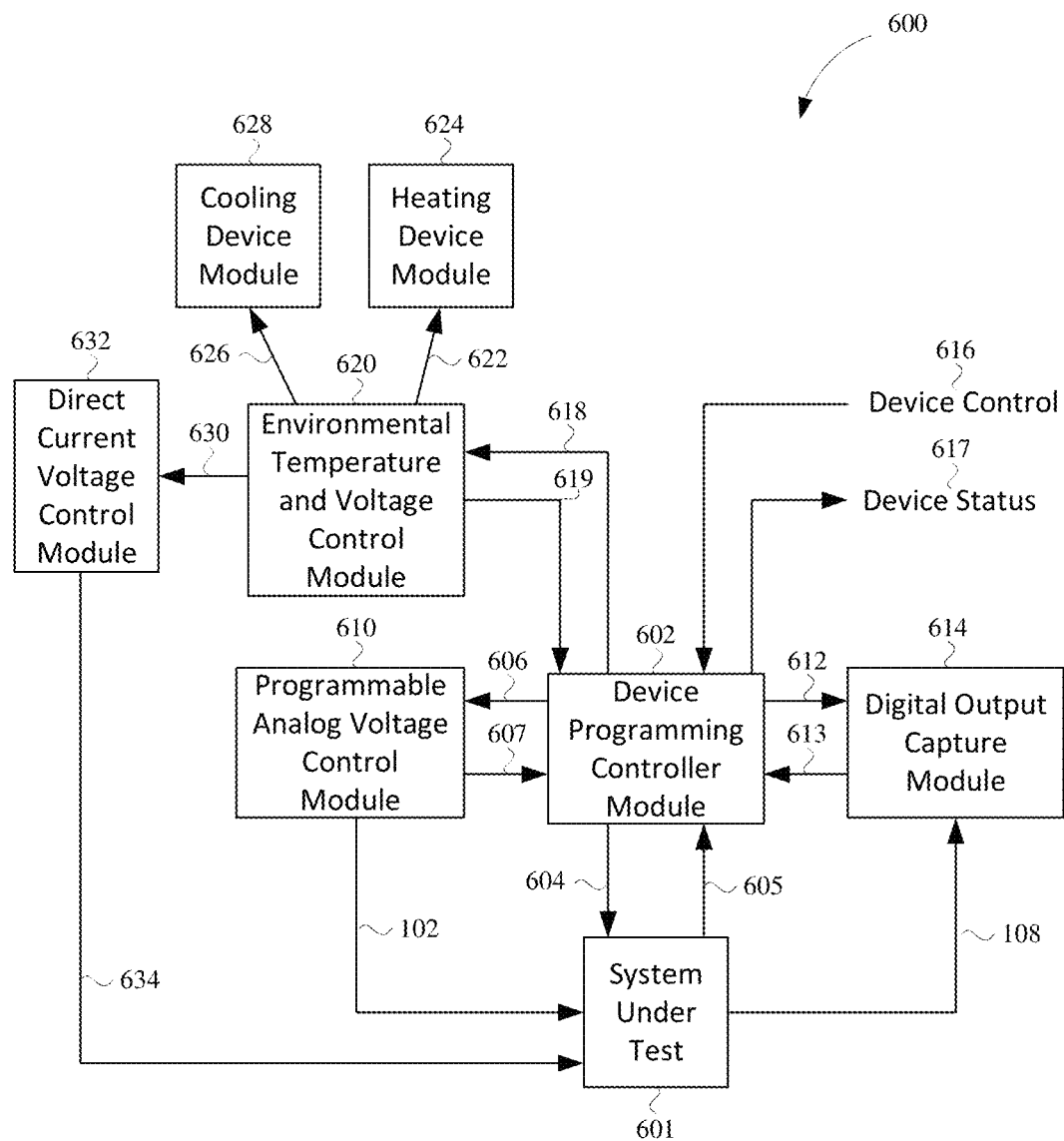
FIG. 6 is a block diagram of a system under manufacturing fabrication, testing and optionally programming, according to one aspect of the present disclosure.

FIG. 6 shows a system under test 601, which is a system that is evaluated, tested, characterized and may be programmed with calibration and configuration data, in one aspect of the present disclosure. A device programming control module 602 controls the overall evaluation, testing, characterization, calibration and any programming of the system under test 601. In one aspect, the system under test 601 is the ADC 100. In another aspect, the system under test 601 is a digital to analog converter (DAC). In yet another aspect, the system under test 601 is another type of analog, digital or mixed signal circuit system.

The device programming control module 602 generates control signals 604 to control and optionally program the system under test 601. Status signals 605 provide feedback from the system under test 601 to the device programming controller module 602, where the status signals 605 may include temperature and voltage sensor data, interim data from the circuit, timing information, testing status, calibration status, characterization data, programming status or other useful information.

In one aspect, analog voltage control signals 606 are used by the device programming controller module 602 to control and configure the programmable analog voltage control module 610. Analog voltage status signals 607 provide feedback data and status from the programmable analog voltage control module 610 to the device programming controller module 602. The analog voltage control module 610 provides the analog input 102 to the system under test 601 during the testing, calibration, characterization or other procedures.

Output capture control signals 612 provide control for a digital output capture module 614 from the device programming controller module 602. Output capture status signals 613 provide status and the captured digital output from the digital output capture module 614 back to the device programming controller module 602. The digital output capture module 614 is used to capture and report the digital output 108 from the system under test 601. The system under test 601 may be operating at a significantly higher clock frequency than the device programming controller module 602 so a programmed analog input 102 sequences and digital output 108 capture sequences may be used.

Device control signals 616 are used to start, stop and control the operation of the tester system operation. Device status signals 617 provide status related to the system under test 601 and the tester system operation. For example, a test running, testing passed or testing failed status may be provided.

Environmental control signals 618 provide control information to an environmental temperature and voltage control module 620 from the device programming controller module 602. Environmental status signal 619 provide status and state information to the device programming controller module 602 from the environmental temperature and voltage control module 620. The environmental temperature and voltage control module 620 provides control over the tester system environmental parameters applied to the system under test 601. These environmental parameters may include temperature, direct current core voltage, direct current input and output driver voltage and other environmental parameters.

Heating control signals 622 provides control information from the environmental temperature and voltage control module 620 to a heating device module 624. The heating device module 624 is used to heat the system under test 601 above an ambient temperature. Cooling control signals 626 provide control information from the environmental temperature and voltage control module 620 to a cooling device module 628 that is used to cool the system under test 601 below the ambient temperature.

Direct current voltage control signals 630 provide control information from the environmental temperature and voltage control module 620 to a direct current voltage control module 632 that provides a core and input and output driver direct current voltage for the system under test 601. Direct current voltage signals 634 provide power from the direct current voltage control module 632 to the system under test 601.

It is noteworthy that the various aspects disclosed herein are not intended to limit the tester system 600 to only these modules. The tester system 600 may have few or more modules depending on used functions. It should be noted that multiple modules may be combined, but are shown separate for clarity purposes.

Figure 7:
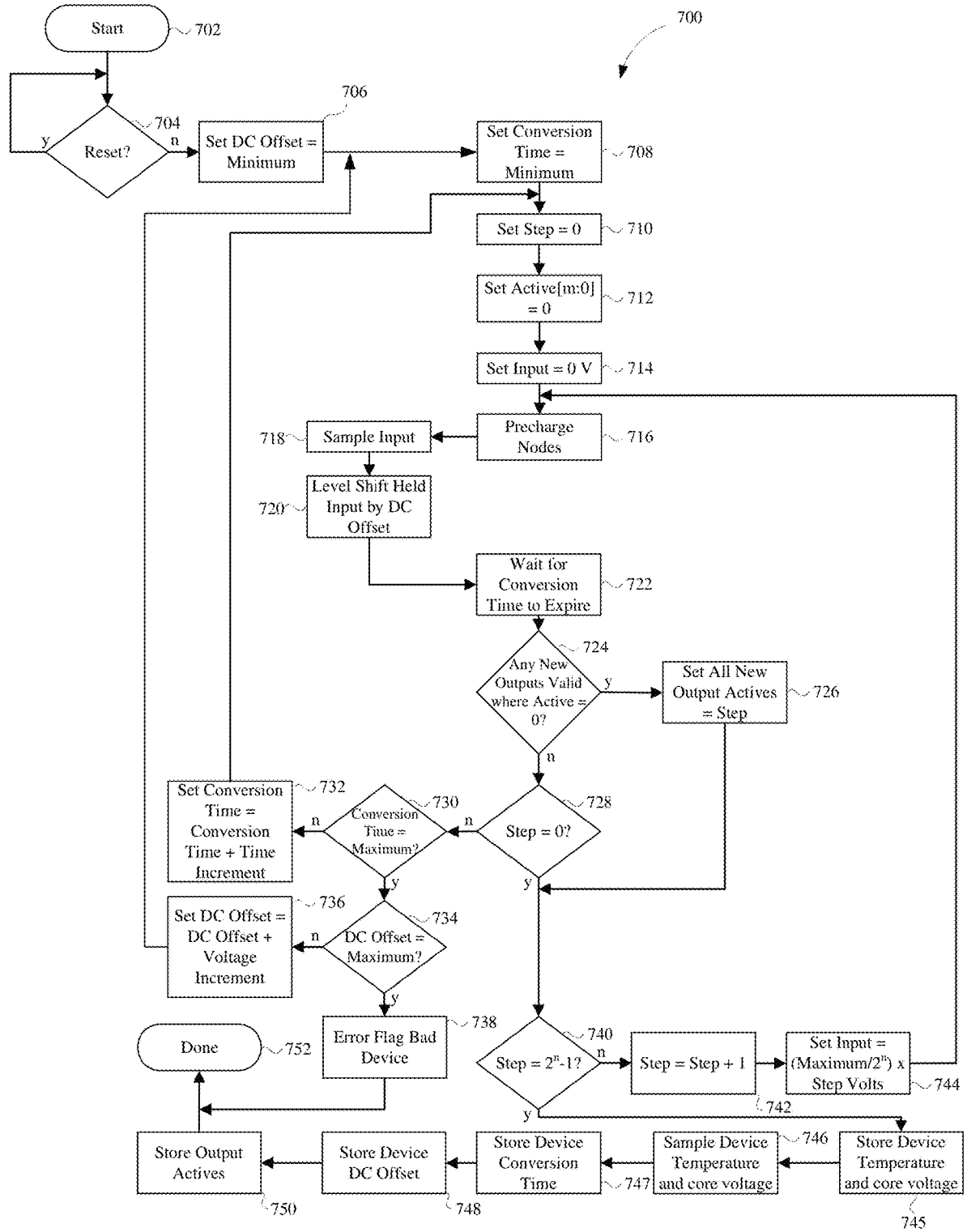
FIG. 7 shows a flow diagram illustrating device selection from fabricated distribution, according to the various aspects as described herein.

Flow Diagram 700: FIG. 7 shows a process 700 executed by the device programming controller module 602 or similar module for device selection with un-programmable devices, according to one aspect of the present disclosure. Process flow 700 is repeated for each flash comparator module 202A-202N. In one aspect, a separate process flow is executed in parallel for each flash comparator module 202A-202N.

The selection process flow 700 starts in block 702. The process proceeds to block 704 when the process determines if a reset is active. The reset forces the device programming controller module 602 or similar module processing the flow to the initial state as well as any flow related storage, configuration data, other parts of the test and characterization system, the system under test 601 and any other area that needs a specific initial state. If a reset is active in block 704, then the process simply waits in block 704 for the reset to become inactive.

If reset is inactive in block 704, then in block 706, a direct current (DC) offset voltage value is set to a certain value, for example, a minimum starting value. The analog input 102 is level shifted by the DC offset voltage. This is executed to bring a sampled and held analog input 102 within an active range of the conversion devices.

In block 708, the conversion time is set to a certain value, for example, a minimum starting value. In block 710, a step count is initialized to zero. The step count is a tracking number used by the process flow to represent the quantized digital output 108. The step count allows the process flow to associate flash comparator module 202A-202N outputs to represent a digital output 108 value. In block 712, a list of active array elements of the flow process temporary storage are set to zero or another initial value. The active array elements hold the association between the flash comparator module 202A-202N outputs and the step value which represents the digital output 108. The number of active array elements is approximately equal to the number of flash comparator module 202A-202N outputs.

In block 714, the analog input 102 is set to zero volts. In block 716, the nodes, for example 315A-315N, are precharged to a logical "1" value.

In block 718, the analog input 102 is sampled and held. In block 720, the held analog value is voltage shifted by the DC offset voltage. In block 722, the process waits for an amount of time equal to a current conversion time. After the time delay, in block 724 the process determines if there are any new output valids (actives) from the flash compare modules 202A-202N. In this case, new refers to the flash compare modules 202A-202N outputs not already active during a previous iteration of the process flow.

If newly active outputs are detected, then in block 726 and the process storage associated with the newly active outputs of the flash compare modules 202A-202N are set to a value that represents a current $2^n$ step value. If no newly active outputs of the flash compare modules 202A-202N are detected for the current conversion of the new analog input 102 value, then in block 728, the process determines if this is the first step value. If the current step value is the first value then the process proceeds to block 740 described below.

If the current step value is not the first value then no flash compare modules 202A-202N outputs were detected to represent the digital value of the analog input 102. This is considered to be an error and processing proceeds to block 730 to determine if adjustments could be made and the system should be retested. It should be noted, that block 728 is optional and needed when the digital output 108 value of zero is represented when no flash comparator module 202A-202N outputs are active. If digital output 108 value of zero is represented by an active flash comparator module 202A-202N output then block 728 would not be present.

In block 730, a current conversion time is compared to a maximum allowed conversion time. If the current conversion time is not equal, less than, the maximum conversion time, then in block 732 where the conversion time is increased and the testing restarts at block 710. If the current conversion time is equal to the maximum conversion time, then in block 734 a test is performed on the current DC offset value. In block 734, if the current DC offset value is not equal, less than, the maximum DC offset value then in block 736, the current DC offset value is increased and the testing restarts at block 708. If the current DC offset value is equal to the maximum DC offset value system under test 601 is detected as being bad then in block 738, an error flag is set indicating the test failure after all available adjustments to conversion time and offset voltage have been made and unsuccessful processing completes in block 752. For successful testing there is at least one new flash comparator module 202A-202 N output active for each tested analog input 102 value for a fixed conversion time and DC offset voltage value.

In another aspect, each flash comparator module 202A-202 N may have unique values for conversion time and DC offset voltage as could be provided by a more complex testing technique.

In block 726 and in block 728 when the current step is equal to zero, the first step, processing proceeds to block 740. In block 740, the process determines if the current step is the last step. There are $2^n$ steps starting at step equal to zero. In block 740, if the current step is not equal to $2^n-1$, last step, then in block 742, the current step value is increased by one and then in block 744, the analog input 102 is set to the next test value and processing proceeds back to block 716 for continued testing of subsequent step values.

In block 740, if the current step is equal to $2^n-1$, i.e. the last step, the testing is completed. In block 745, the current system under test 601 temperature and core voltage is sampled by the temperature and voltage sensor module 234, 234A-234N. In block 746, the sampled temperature and core voltage is stored in a memory device for use in temperature and core voltage compensation processing. In block 747, the successful conversion time is stored in memory for operational use. In block 748, the successful value of the DC offset voltage is stored in memory for operational use. In block 750, the associations between the flash comparator module 202A-202N outputs and the step values are stored in memory for operational use by device selection module 206A-206N for operation and processing proceeds to a successful completion at block 752. In process flow 700, the step value is described as an increasing value with each iteration of the process flow and is not intended to limit the process flow and the process flow could be rewritten to support a decreasing step value.

Figure 8A:
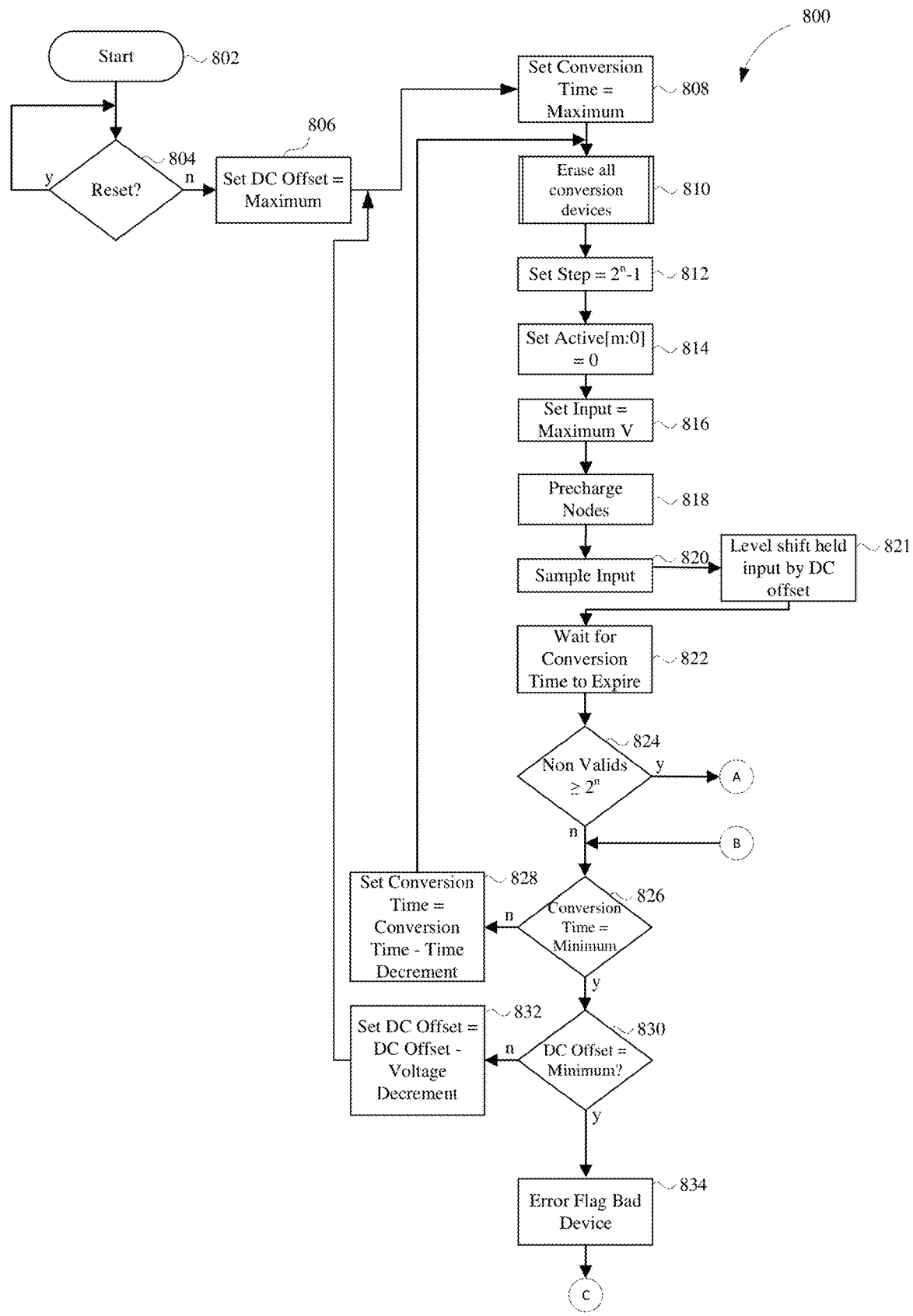
FIG. 8a shows a flow diagram illustrating device selection and programming, according to the various aspects as described herein.
Figure 8B:
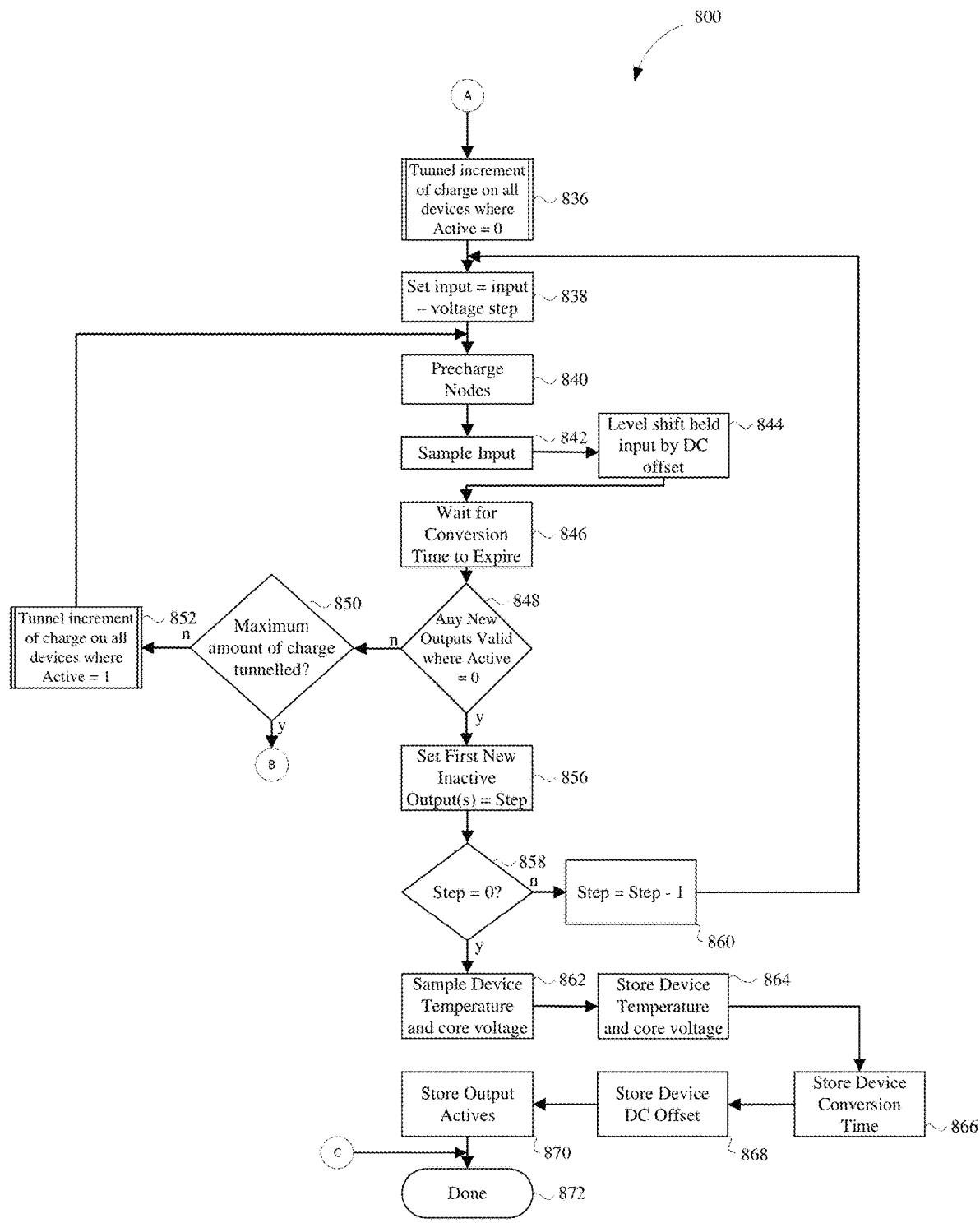
FIG. 8b shows a continuation flow diagram of FIG. 8a illustrating device selection and programming, according to the various aspects as described herein.

Flow Diagram 800: FIGS. 8a-8b show a device selection process 800 for programmable threshold devices executed by the device programming controller module 602 or similar module, according to one aspect of the present disclosure. Process 800 may be repeated for each flash comparator module 202A-202N. In one aspect, a separate process flow is executed in parallel for each flash comparator module 202A-202N. The selection process flow 800 starts in the start block 802.

In block 804, the process determines if a reset is active. If the reset is active in block 804, then the process waits in block 804 for the reset to become inactive. If reset is inactive then in block B806, a direct current (DC) offset voltage is set to a certain value, for example, a maximum starting value. The analog input 102 is level shifted by the DC offset voltage. This is performed to bring the sampled and held analog input 102 within an active range of the conversion devices.

In block 808, the conversion time is set, for example, to a maximum starting value. In block 810, the programmable devices are all erased by tunneling charge out of the oxide if needed. In block 812, the step count is initialized to $2^n-1$. In block 814, the list of active array elements are set to zero or another initial value. In block 816, the analog input 102 is set to a maximum value. In block 818, the various nodes are precharged to a logical "1" value.

In block 820, the analog input 102 is sampled and held. In block 821, the held analog value is voltage shifted by the DC offset voltage. In block 822, the process waits for an amount of time equal to a current conversion time. After the time delay, in block 824, a test is performed to determine if the number of inactive output valids from the flash comparator modules 202A-202N is greater or equal to $2^n$. This determines if there are enough flash comparator modules 202A-202N outputs that can be programmed to represent all of the digital output 108 values from zero (0) to $2^n-1$.

If the number of inactive output valids from the flash compare modules 202A-202N is greater than or equal to $2^n$ then processing continues to block 836 of FIG. 8b, where charge is tunneled. If the number of inactive output valids from the flash compare modules 202A-202N is less than $2^n$, then the process determine if adjustments could be made and the system retested. In block 826, the current conversion time is compared to a minimum allowed conversion time. If the current conversion time is not equal to the minimum conversion time, then in block 828, the current conversion time is decreased and the testing restarts back at block 810. If the current conversion time is equal to the minimum conversion time, then in block 830 the process determines if the current DC offset value is equal to a minimum value. If not, then in block 832, the current DC offset value is decreased and the testing restarts back at block 808. If the current DC offset value is equal to the minimum DC offset value, the system under test 601 is detected as being bad and an error flag is set in block 834 indicating the test failure after all available adjustments to conversion time and offset voltage have been made and unsuccessful processing completes in block 872. For successful testing, at least one new flash comparator module 202A-202 N output active is needed for each tested analog input 102 value for a fixed conversion time and DC offset voltage value.

In another aspect, each flash comparator module 202A-202N may have unique values for conversion time and DC offset voltage as could be provided by a more complex testing algorithm.

Referring now to FIG. 8b, in block 836, a programmable increment of charge is tunneled and captured in all devices where the outputs of the flash comparator module 202A-202N are inactive. In block 838, the analog input 102 is set to the current value minus the voltage step value. In block 840, the nodes are pre-charged to a logical "1" value. In block 842, the analog input 102 is sampled and held. In block 844, the held analog value is voltage shifted by the DC offset voltage. In block 846, the process waits for an amount of time equal to the current conversion time. After the time delay, in block 848, the process determines if there are any new output valids that are inactive from the flash comparator modules 202A-202N. In this case, new refers to the flash comparator modules 202A-202N outputs not already inactive during a previous iteration of the process flow.

If newly inactive outputs are detected, then in block 856, the storage associated with the newly inactive outputs of the flash compare modules 202A-202N are set to a value that represents the current step value. If no newly inactive outputs of the flash comparator modules 202A-202N are detected for the current conversion of the new analog input 102 value, then in block 850, the process determines if the maximum amount of charge has already been tunneled during previous iterations. If the maximum amount of charge has already been tunneled into the devices, processing proceeds back to block 826, FIG. 8a, as described above. If the maximum amount of charge has not already been tunneled into the devices, then in block 852, a programmable increment of charge is tunneled and captured in all devices where the outputs of the flash comparator module 202A-202N are active and processing proceeds to back block 840 for continued testing.

In block 856, process storage associated with the newly inactive outputs of the flash comparator modules 202A-202N are set to a value that represents the current step value. In block 858, the process determines if the current step is the last step. There are $2^n$ steps starting at step equal to $2^n-1$ and counting down to zero. In blocks 858, if the current step is not equal to zero, i.e. the last step, then in block 860, the current step value is decreased by one. In block 838, the analog input 102 is set to the next test value and processing proceeds to block 840 for continued testing of subsequent step values.

In block 858, if the current step is equal to zero, i.e. the last step, the testing was successfully completed. In block 862, the current system under test 601 temperature and core voltage is sampled by the temperature and voltage sensor module 234, 234A-234N. In block 864, the sampled temperature and core voltage is stored in a memory device for use in temperature and core voltage compensation processing. In block 866, the successful conversion time is stored in memory for operational use. In block 868, the successful value of the DC offset voltage is stored in memory for operational use and processing proceeds to block 870. In block 870, the associations between the flash comparator module 202A-202N outputs and the step values are stored in memory for operational use by device selection module 206A-206N for operation and processing proceeds to a successful completion at block 872. In process flow 800, the step value is described as a decreasing value with each iteration of the process flow and is not intended to limit the process flow and the process flow could be rewritten to support an increasing step value.

Figure 9:
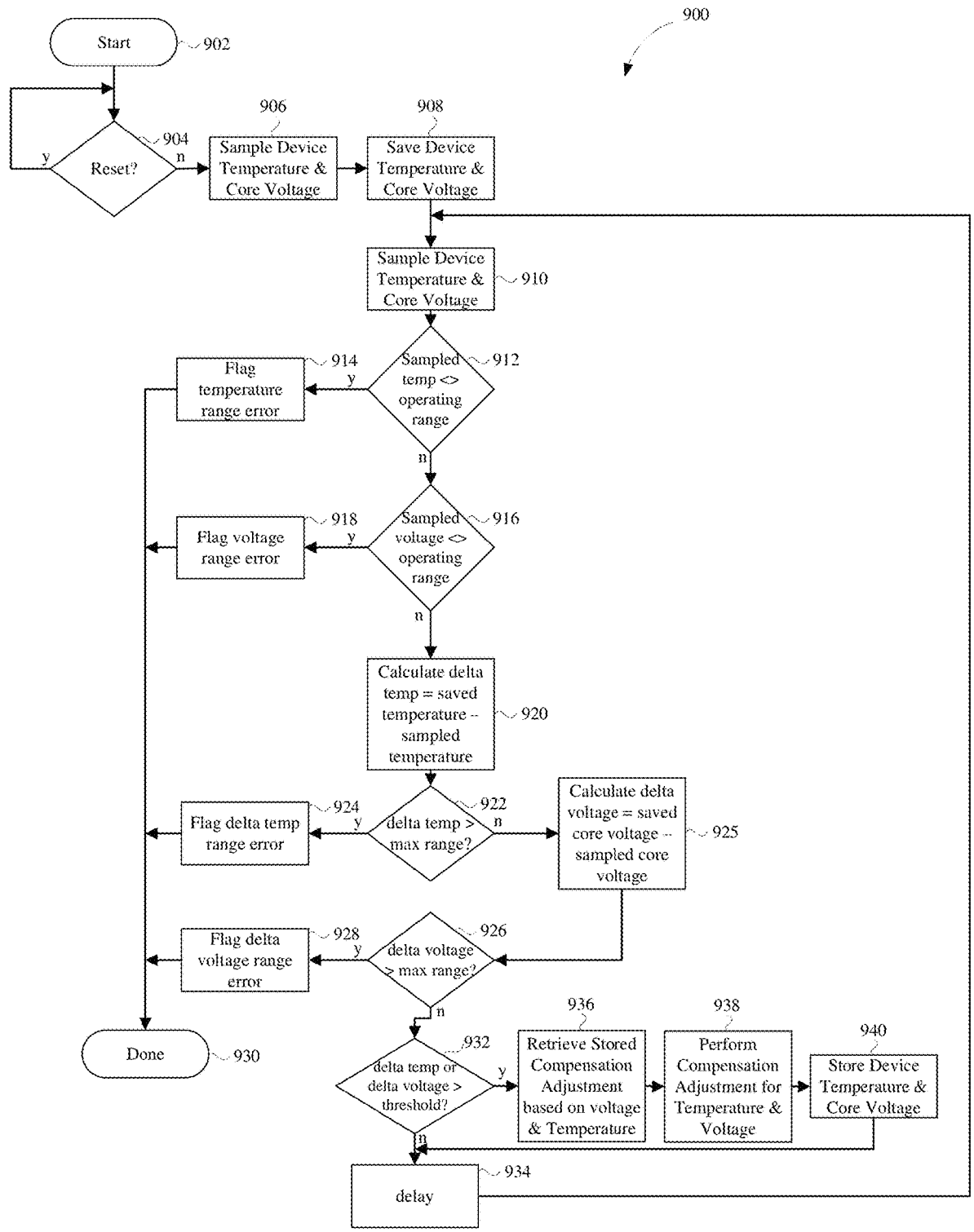
FIG. 9 shows a flow diagram illustrating temperature compensation, according to the various aspects as described herein.

Flow Diagram 900: FIG. 9 shows a process 900 for system temperature and core voltage compensation processing executed by selection temperature and voltage compensation module 232A-232N, Temperature and voltage threshold compensation module 236A-236N, digital temperature and voltage compensation module 240, state machine module 218 or similar module performing compensation, according to one aspect of the present disclosure. The compensation process flow 900 starts in block 902.

In block 904, the process determines if a reset is active. If a reset is active, then the process waits for the reset to become inactive. If reset is inactive in block 904, then in block 906, the current temperature and core voltage of the system is sampled. In block 908, the newly sampled current system temperature and core voltage are stored in a memory for later processing.

In block 910, the device temperature and core voltage are sampled. In block 912, the sampled temperature is compared against an operating range. If the sample temperature is outside the system operating range, then in block 914, a flag is set signifying a temperature range error and processing proceeds to block 930 where processing is completed.

If the sample temperature is within the system operating range, then in block 916, the sampled core voltage is compared against the operating range. If the sample core voltage is outside the system operating range, then in block 918, a flag is set signifying a core voltage range error and processing proceeds to block 930 where processing is completed.

If the sample core voltage is within the system operating range, then in block 920, the delta temperature is calculated by subtracting the newly sample temperature from the saved temperature.

In block 922, the delta temperature is compared to a maximum range. If the calculated delta temperature is greater than the maximum range, then in block 924, a delta temperature error flag is set and processing proceeds to block 930 where processing is completed.

If the calculated delta temperature is less than the maximum range, then in block 925, delta voltage is calculated by subtracting the newly sampled core voltage from the saved core voltage. In block 926, the calculated delta core voltage is compared to a maximum range. If the delta core voltage is greater than the maximum range, then in block 928, a delta core voltage range error flag is set and the process ends at block 930.

If the delta voltage is not greater than the maximum range, then in block 932, the process determines if either the delta temperature or the delta core voltage are greater than a programmable threshold. If either the delta temperature or the delta core voltage are greater than a threshold, processing proceeds to block 936. In block 936, the stored temperature and core voltage compensation adjustment values are retrieved from a memory. In one aspect, the compensation adjustment values retrieved are based on the current system temperature and core voltage. In another aspect, the compensation adjustment values retrieved are based on the delta temperature and delta core voltage. In block 938, the retrieved temperature and core voltage compensation adjustment values are used to adjust system parameters to compensate for the digital output 108 differences for the same analog input 102 value due to temperature and core voltage changes that are occurring during system operation. In block 940, the newly sampled system temperature and core voltage are stored in a memory and processing proceeds to block 934.

If neither the delta temperature nor the delta core voltage are greater than a threshold processing as determined in block 932, then in block 934, the processing is delayed for a programmable period of time to provide stable system temperature and core voltage compensation. The delay provides hysteresis and control stability to the compensation process. After the expiration of the time delay in block 934, processing proceeds back to block 910. In one aspect, only temperature compensation is performed. In another aspect, only core voltage compensation is performed.

Figure 10:
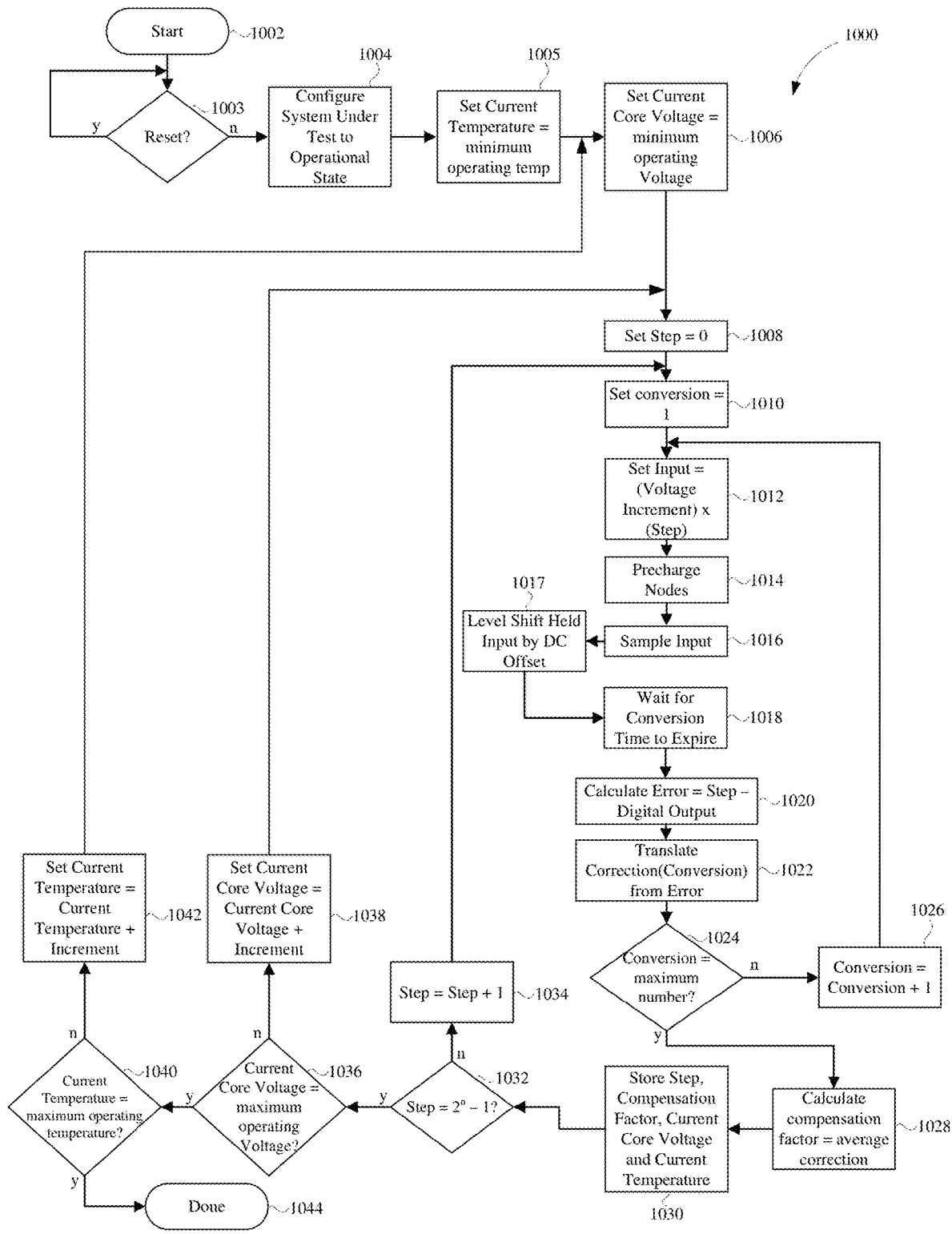
FIG. 10 is a flow diagram illustrating temperature compensation factor calculation, according to one aspect of the present disclosure.

Flow Diagram 1000: FIG. 10 shows a process 1000 for system temperature and core voltage compensation factor data generation processing executed by device programming controller module 602 or similar module, according to one aspect of the present disclosure. The compensation data generating process 1000 starts in block 1002.

In block 1003, the process determines if a reset is active. If reset is active in block 1003, the process waits for the reset to become inactive.

If reset is inactive in block 1003, then in block 1004 the system under test 601 is configured into the operational state. In block 1005, a current temperature of the system under test 601 is set, for example, to a minimum operating temperature. In block 1006, the current core voltage of the system under test 601 is set, for example, to a minimum operating core voltage. In block 1008, the step count is set equal to zero. In block 1010, a conversion iteration is set equal to one. In block 1012, an input voltage is set equal to a voltage increment multiplied by the step count. In block 1014, the internal nodes 315A-315N or similar of the system are pre-charged. In block 1016, the analog input 102 is sampled. In block 1017, the held analog value is voltage shifted by the DC offset voltage and in block 1018, process waits for the conversion time to expire. After the expiration of the conversion time, in block 1020, the calculated error is set equal to the step minus the digital output 108. In block 1022, the calculated error is converted or translated into a temperature and core voltage correction values. These correction values are stored for each conversion iteration and are later used to calculate average correction values.

In block 1024, the conversion iteration number is compared to a maximum conversion number. In block 1024 if the conversion iteration is not equal to the maximum number, processing proceeds to block 1026. In block 1026, the conversion iteration is incremented by one and processing proceeds back to block 1012 and continues to a next conversion iteration.

If in block 1024, the conversion iteration number is equal to the maximum number, then in block 1028, the compensation factors are calculated as an average of the correction values for each iteration of the conversion processes. An independent compensation factors are calculated for each set of temperature, core voltage and step value. In block 1030, the step, compensation factor, current core voltage and current temperature values are stored in a memory for operational temperature and core voltage compensation.

In block 1032, the process determines if the step count is equal to $2^n-1$, i.e., the last step. In block 1032 if the step count is not equal to $2^n-1$, then in block 1034, the step count is incremented by one and processing proceeds back to block 1010 for processing of the next step value.

In block 1032 if the step count is equal to $2^n-1$, then in block 1036, the process determines if the current core voltage is equal to the maximum operating core voltage. In block 1036, if the current core voltage is not equal to the maximum operating core voltage, then in block 1038, the current core voltage is incremented by the voltage increment and processing proceeds back to block 1008.

In block 1036, if the current core voltage is equal to the maximum operating core voltage, then in block 1040, the process determines if the current temperature is equal to the maximum operating temperature. In block 1040, if the current temperature is equal to the maximum operating temperature, the process ends in block 1044. In block 1040 if the current temperature is not equal to the maximum operating temperature, then in block 1042, the current temperature is incremented by the temperature increment and processing proceeds back to block 1006. In one aspect, the temperature and core voltage compensation factors are computed from an average value derived from multiple conversion cycles. In one aspect, only temperature compensation factors are generated. In another aspect, only core voltage compensation factors are generated.

In one aspect a system is provided. The system a plurality of flash compare modules to output a set of unordered output signals based on an analog input signal; a plurality of device selection modules that receive the unordered output signals and generate ordered signals representing the analog input; and a temperature and voltage compensation module for receiving one or more of temperature and voltage signals from at least a temperature and voltage sensor module that senses one or more of temperature and voltage values that are used to compensate for changes in output signals caused by changes in one or more of die temperature and core voltage.

In another aspect a system for analog to digital conversion is provided. The system includes a plurality of flash compare modules to output a set of unordered output signals based on an analog input signal; a plurality of device selection modules that receive the unordered output signals and generate ordered uncorrected thermometer encoded signals representing the analog input; a plurality of error correction modules that receive outputs from the plurality of device selection modules to generate corrected thermometer encoded signals that are provided to a thermometer to one-hot encoding module to generate one-hot encoded signals; a state machine for controlling selection of outputs from the plurality of error correction modules; a binary encoding module to convert the one-hot encoded signals into a digital output by a binary encoding module; and a temperature and voltage compensation module whose output is used to compensate for changes in one or more of die temperature and core voltage compensation in an analog value to the digital output.

In yet another aspect, a system for analog to digital conversion is provided. The system includes a plurality of flash compare modules to output a set of unordered output signals based on an analog input signal; a plurality of device selection modules that receive the unordered output signals and generate ordered uncorrected thermometer encoded signals representing the analog input; a selection temperature and voltage compensation module for receiving temperature and voltage signals from at least a temperature and voltage sensor module that senses temperature and voltage values that are used to modify configuration data used by the plurality of device selection modules for generating the ordered uncorrected thermometer encoded signals; a plurality of error correction modules that receive outputs from the plurality of device selection modules to generate corrected thermometer encoded signals that are provided to a thermometer to one-hot encoding module to generate one-hot encoded signals; a state machine for controlling selection of outputs from the plurality of error correction modules, where the state machine controls a multiplexer to time interleave outputs from the plurality of error correction modules; and a binary encoding module to convert the one-hot encoded signals into a digital output.

In another aspect, methods and systems are provided for circuits. One method is for increasing device threshold voltage distribution of a plurality of devices of a circuit. The method includes adjusting a device threshold voltage of the plurality of devices by different amounts; and selecting a subset of the plurality of devices with adjusted device threshold voltage by a device selection module for performing a function associated with the circuit.

In yet another aspect, a system for device threshold voltage adjustment is provided. The system includes a sensor module for sensing one or more of temperature and voltage values of a die having a plurality of devices for a circuit; and a threshold temperature and voltage compensation module for receiving an input value from the sensor module to compensate variation in a device threshold voltage caused by changes of one or more of temperature and voltage of the die.

In another aspect, a system is provided that includes an input sampling circuit to capture an input signal value; a compare module that outputs signals based on the input signal value; a selection module that arranges one or more outputs of the compare module; where the compare module includes one or more conversion devices with adjustable device threshold voltage values.

The various aspects described above may be implemented using circuitry and/or software modules that interact to provide particular results. One of skill in the computing arts can readily implement such described functionality, either at a modular level or as a whole, using knowledge generally known in the art. For aspect, the flowcharts illustrated herein may be used to create computer-readable instructions/code for execution by a processor. Such instructions may be stored on a non-transitory computer-readable medium and transferred to the processor for execution as is known in the art.

The foregoing descriptions of the aspects have been presented for the purposes of illustration and description. It is not intended to be exhaustive or to limit the inventive concepts to the precise form disclosed. Many modifications and variations are possible in light of the above teaching. Any or all features of the disclosed aspects can be applied individually or in any combination and are not meant to be limiting, but purely illustrative. It is intended that the scope be limited not with this detailed description, but rather determined by the claims appended hereto.

What is claimed is:

1. A system comprising:
    a plurality of devices of a circuit for performing a function associated with the circuit; and
    a temperature compensation module for receiving one or more temperature signals from a temperature sensor module that senses temperature values that are used to compensate for any changes in performing the function associated with the circuit caused by changes in temperature;
    wherein adjustments are made to a device body voltage of one or more of the plurality of devices to adjust a device threshold voltage curve up or down to compensate for any changes in temperature.

2. The system of claim 1, wherein the circuit generates a digital output by performing analog to digital conversion.

3. The system of claim 2, wherein the circuit further comprising: a memory storing information used to modify the digital output to compensate for changes in temperature.

4. A system comprising:
    a plurality of devices of a circuit for performing a function associated with the circuit;
    a voltage compensation module for receiving one or more of voltage signals from a voltage sensor module, the voltage sensor module senses core voltage values and provides the one or more voltage signals to represent the core voltage values, the one or more voltage signals used to compensate for changes in performing the function associated with the circuit caused by changes in core voltage, the core voltage used to power one or more circuits of the system.

5. The system of claim 4, wherein the circuit generates a digital output by performing analog to digital conversion.

6. The system of claim 5, wherein the circuit further comprising: a memory storing information used to modify the digital output to compensate for changes in voltage.

7. The system of claim 4, wherein adjustments are made to a device body voltage of one or more of the plurality of devices to adjust a device threshold voltage curve up or down to compensate for changes in voltage.

8. A system comprising:
    a plurality of devices of a circuit for performing analog to digital conversion; and
    a compensation module for receiving a temperature signal or a voltage signal, or both the temperature and the voltage signal from at least a sensor module that senses a temperature value or a voltage value, or both the temperature and the voltage value that are used to provide a digital offset value to be added or subtracted from an unadjusted digital output value of the circuit to compensate for temperature, voltage or both temperature and voltage changes that occur during system operation.

9. The system of claim 8, wherein the circuit includes a memory storing offset values used to modify the digital output to compensate for changes in temperature.

10. The system of claim 9, wherein the offset values are stored in the memory that is addressed by a measured device temperature and core voltage of the circuit.

11. A system comprising:
    a plurality of devices of a circuit for performing a function associated with the circuit;
    a voltage compensation module for receiving one or more of voltage signals from a voltage sensor module that senses voltage values that are used to compensate for changes in performing the function associated with the circuit caused by changes in voltage;
    wherein adjustments are made to a device body voltage of one or more of the plurality of devices to adjust a device threshold voltage curve up or down to compensate for changes in voltage.

12. The system of claim 11, wherein the circuit generates a digital output by performing analog to digital conversion.

13. The system of claim 12, wherein the circuit further comprising: a memory storing information used to modify the digital output to compensate for changes in voltage.

* * * * *